United States Patent
Jeong et al.

(10) Patent No.: US 10,663,863 B2
(45) Date of Patent: *May 26, 2020

(54) METHOD OF PRODUCING LAYER STRUCTURE, AND METHOD OF FORMING PATTERNS

(71) Applicant: SAMSUNG SDI CO., LTD., Yongin-si, Gyeonggi-do (KR)

(72) Inventors: Seulgi Jeong, Suwon-si (KR); Minsoo Kim, Suwon-si (KR); Sunghwan Kim, Suwon-si (KR); Hyunji Song, Suwon-si (KR); Sunhae Kang, Suwon-si (KR); Youngmin Kim, Suwon-si (KR); Yoona Kim, Suwon-si (KR); Jinhyung Kim, Suwon-si (KR); Younhee Nam, Suwon-si (KR); Jaeyeol Baek, Suwon-si (KR); Byeri Yoon, Suwon-si (KR); Chungheon Lee, Suwon-si (KR); Seunghee Hong, Suwon-si (KR); Sunmin Hwang, Suwon-si (KR)

(73) Assignee: Samsung SDI Co., Ltd., Yongin-Si, Gyeonggi-do (KR)

( * ) Notice: Subject to any disclaimer, the term of this patent is extended or adjusted under 35 U.S.C. 154(b) by 161 days.

This patent is subject to a terminal disclaimer.

(21) Appl. No.: 15/264,654

(22) Filed: Sep. 14, 2016

(65) Prior Publication Data

US 2017/0115572 A1 Apr. 27, 2017

(30) Foreign Application Priority Data

Oct. 23, 2015 (KR) .................. 10-2015-0148200

(51) Int. Cl.
*G03F 7/09* (2006.01)
*G03F 7/11* (2006.01)

(52) U.S. Cl.
CPC ............... *G03F 7/11* (2013.01); *G03F 7/091* (2013.01)

(58) Field of Classification Search
CPC ............ G03F 7/11; G03F 7/091; G03F 7/094
See application file for complete search history.

(56) References Cited

U.S. PATENT DOCUMENTS

| | | | | |
|---|---|---|---|---|
| 6,720,256 B1* | 4/2004 | Wu | .................. | H01L 21/76808 257/E21.579 |
| 10,312,074 B2* | 6/2019 | Kim | .................. | G03F 7/40 |
| 2003/0054616 A1* | 3/2003 | Endisch | ............. | H01L 21/02282 438/400 |
| 2005/0085050 A1* | 4/2005 | Draney | ............. | H01L 21/02016 438/459 |
| 2005/0215713 A1* | 9/2005 | Hessell | .................. | C08G 59/24 525/162 |
| 2005/0285268 A1 | 12/2005 | Hsu et al. | | |
| 2007/0100084 A1* | 5/2007 | Sung | .................. | C08F 8/42 525/342 |
| 2010/0055610 A1* | 3/2010 | Loccufier | ............. | B41C 1/1016 430/271.1 |

FOREIGN PATENT DOCUMENTS

| | | |
|---|---|---|
| CN | 1447981 A | 10/2003 |
| CN | 1579016 A | 2/2005 |
| CN | 101681096 A | 3/2010 |
| CN | 104253024 A | 12/2014 |
| CN | 104749886 A | 7/2015 |
| CN | 105575775 A | 5/2016 |
| JP | 07-226356 A | 8/1995 |
| JP | 2004-292955 A | 10/2004 |
| JP | 5212666 B2 | 6/2013 |
| JP | 2014-219559 A | 11/2014 |
| KR | 10-2004-0030400 A | 4/2004 |
| KR | 10-2006-0040288 A | 5/2006 |
| KR | 10-2006-0077779 A | 7/2006 |
| KR | 10-0930673 B1 | 12/2009 |
| KR | 10-1212676 B1 | 12/2012 |
| KR | 10-2013-0039864 A | 4/2013 |
| KR | 10-2015-0001446 A | 1/2015 |
| KR | 10-2016-0038462 A | 4/2016 |
| TW | I320874 B | 2/2010 |
| TW | 201229671 A | 7/2012 |

OTHER PUBLICATIONS

Taiwanese Search Report dated Jul. 5, 2017 for corresponding Taiwanese Patent Application No. 105130379.
Office Action dated May 13, 2019, and the accompanying Search Report dated May 5, 2019, of the corresponding Chinese Patent Application No. 201610860457.9.
Office Action dated Jan. 15, 2020, and the accompanying Search Report dated Nov. 21, 2019 of the corresponding Chinese Patent Application No. 201610860457.9.

* cited by examiner

*Primary Examiner* — Daborah Chacko-Davis
(74) *Attorney, Agent, or Firm* — Lee IP Law, PC

(57) ABSTRACT

A method of producing a layer structure and a method of forming a pattern, the method of producing a layer structure including coating a first composition on a substrate that has a pattern thereon; curing the coated first composition to form a first organic layer; applying a liquid material to the first organic layer to remove a part of the first organic layer; and coating a second composition on remaining parts of the first organic layer; and curing the coated second composition on the remaining parts of the first organic layer to form a second organic layer: wherein the first composition and the second composition each independently include a solvent, and a polymer including a structural unit represented by Chemical Formula 1, $$*\!-\!\!\left[\!-\!A^1\!-\!B^1\!-\!\right]\!-\!*.$$  [Chemical Formula 1]

19 Claims, 6 Drawing Sheets

[Calculation Equation 1]

Sum of Steps = |h0-h1| + |h0-h2| + |h0-h3| + |h0-h4|

METHOD OF PRODUCING LAYER STRUCTURE, AND METHOD OF FORMING PATTERNS

CROSS-REFERENCE TO RELATED APPLICATION

Korean Patent Application No. 10-2015-0148200, filed on Oct. 23, 2015, in the Korean Intellectual Property Office, and entitled: "Method of Producing Layer Structure, and Method of Forming Patterns," is incorporated by reference herein in its entirety.

BACKGROUND

1. Field

Embodiments relate to a method of producing a layer structure and a method of forming patterns.

2. Description of the Related Art

Recently, the semiconductor industry has developed an ultra-fine technique for forming a pattern of several to several tens of nanometers in size. Such an ultrafine technique essentially utilizes effective lithographic techniques.

Some lithographic techniques include providing a material layer on a semiconductor substrate; coating a photoresist layer thereon; exposing and developing the same to provide a photoresist pattern; and etching the material layer using the photoresist pattern as a mask.

SUMMARY

Embodiments are directed to a method of producing a layer structure and a method of forming patterns.

The embodiments may be realized by providing a method of producing a layer structure, the method including coating a first composition on a substrate that has a pattern thereon; curing the coated first composition to form a first organic layer; applying a liquid material to the first organic layer to remove a part of the first organic layer; and coating a second composition on remaining parts of the first organic layer; and curing the coated second composition on the remaining parts of the first organic layer to form a second organic layer: wherein the first composition and the second composition each independently include a solvent, and a polymer including a structural unit represented by Chemical Formula 1,

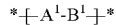

wherein, in Chemical Formula 1, $A^1$ is a divalent cyclic group including at least one of a substituted or unsubstituted benzene ring, $B^1$ is a divalent organic group, and * is a linking point.

The remaining parts of the first organic layer may remain inside gaps of the pattern.

The liquid material may include γ-butyrolactone, δ-valerolactone, ethyllactate, ethyl-3-ethoxypropionate, propylene glycolmonomethyl ether acetate, β-hydroxy β-methylbutyrate, methanol, ethanol, 1-propyl alcohol, 2-propyl alcohol, 2-butanol, ethylene glycol, propylene glycol, glycerol, 1,6-hexanediol, cyclo hexanediol, sorbitol, xylitol, 2-methyl-2,4-pentanediol, 1,3-butanediol, 1,4-butanediol, ethylene glycol monomethyl ether, diethylene glycol, dipropylene glycol, propylene glycol monomethyl ether, diethylene glycol monomethyl ether, triethylene glycol, poly(ethylene glycol), propylene glycol monomethyl ether, dipropylene glycol monomethyl ether, tripropylene glycol monomethyl ether, diethylene glycol monobutyl ether, propylene glycol monomethyl ether acetate, ethylethoxy propionate, propylene glycol monomethyl ether propionate, ethylene glycol diacetate, ethyl lactate, butyl lactate, methyl 2-hydroxyisobutyrate, n-butyl acetate, formamide, monomethylformamide, dimethyl formamide, acetamide, monomethylacetamide, dimethyl acetamide, monoethylacetamide, diethylacetamide, N-methylpyrrolidone, methoxy methyl propionate, methoxy ethyl propionate, methoxy propyl propionate, methoxy butyl propionate, ethoxy methyl propionate, ethoxy ethylpropionate, ethoxy propyl propionate, ethoxy butyl propionate, dimethyl sulfone, dimethyl sulfoxide, sulfolane, acetone, acetyl acetone, methylethyl ketone, methyl isobutyl ketone, or a combination thereof.

The liquid material may be applied in an amount of about 0.1 cc to about 100 cc.

The first organic layer and the second organic layer may be a hardmask layer.

The second organic layer may be directly on the remaining parts of the first organic layer.

In Chemical Formula 1, $A^1$ may be a divalent cyclic group including at least two rings in its structure.

In Chemical Formula 1, $A^1$ may be a substituted or unsubstituted divalent cyclic group of one of the following compounds:

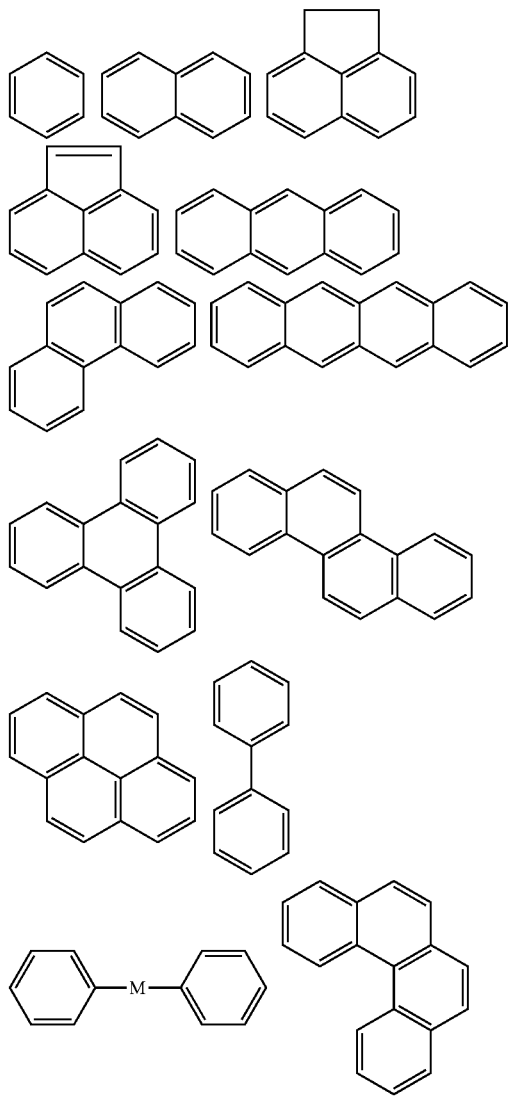

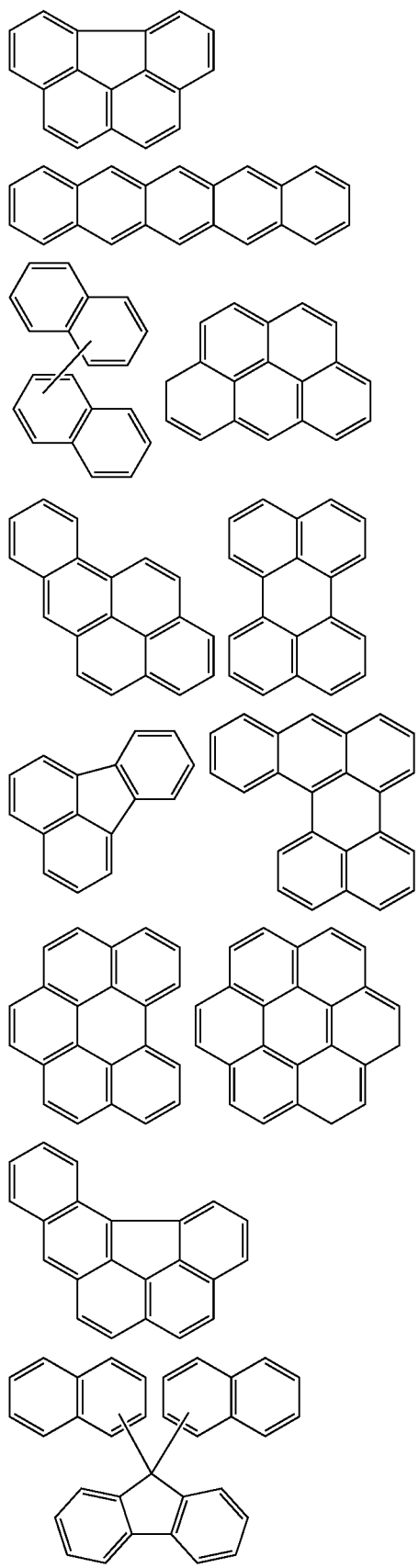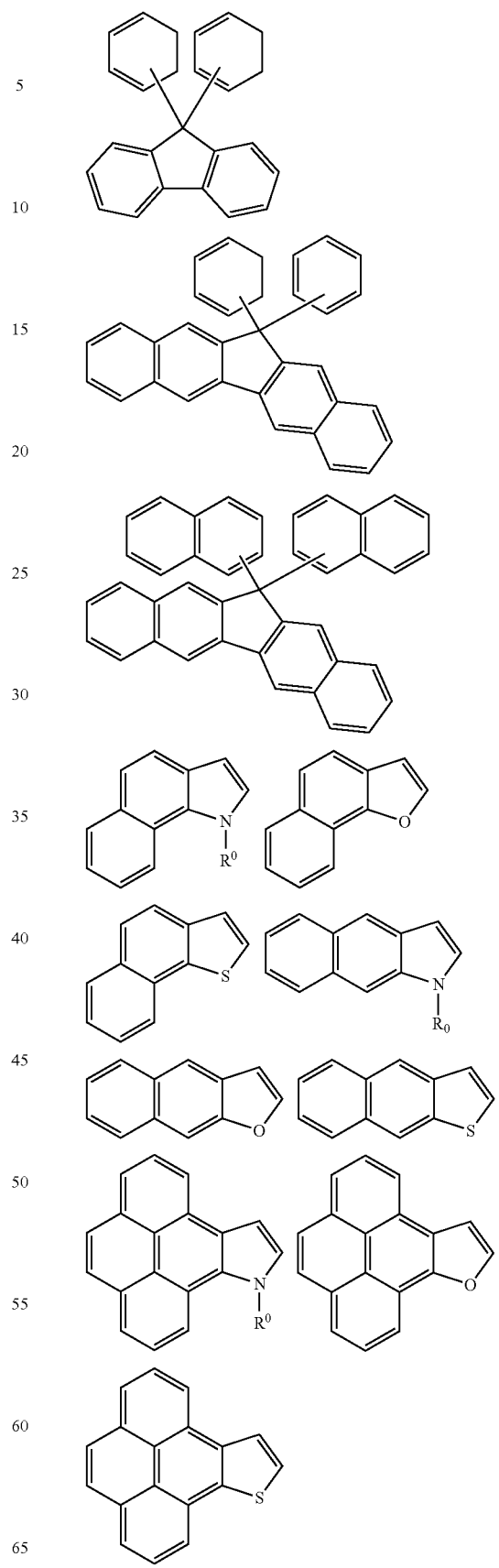

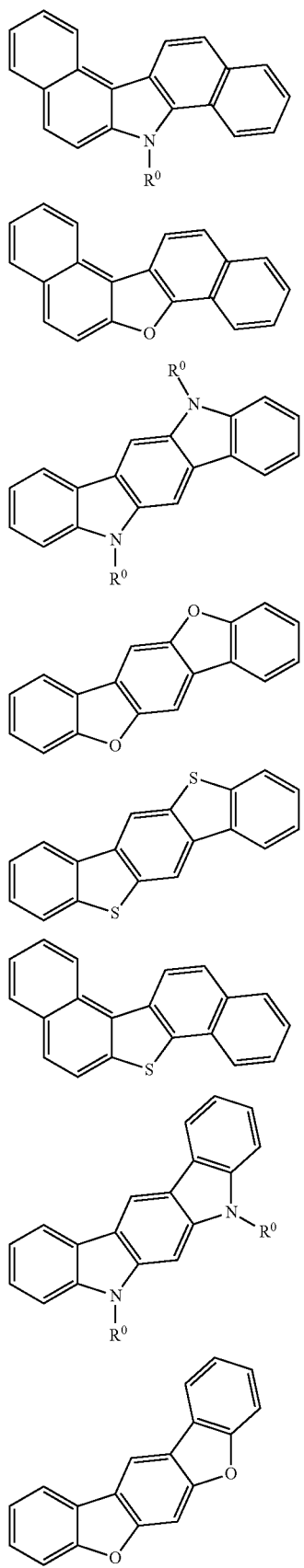
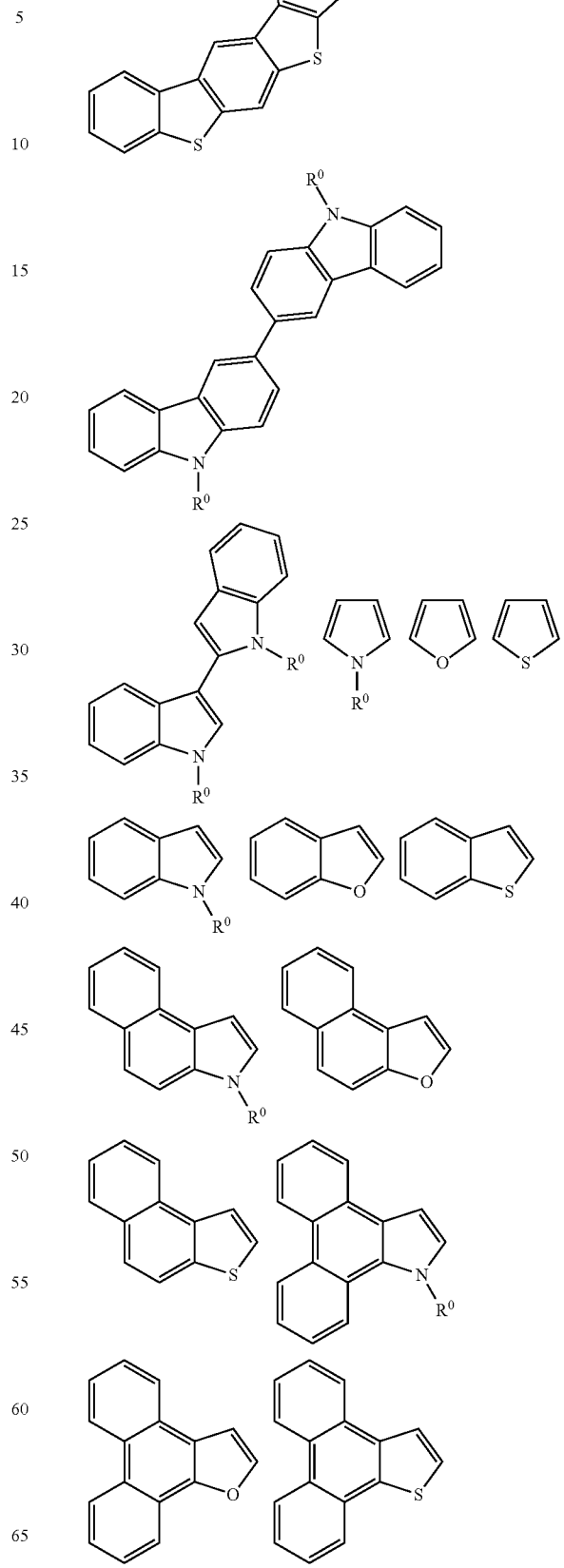

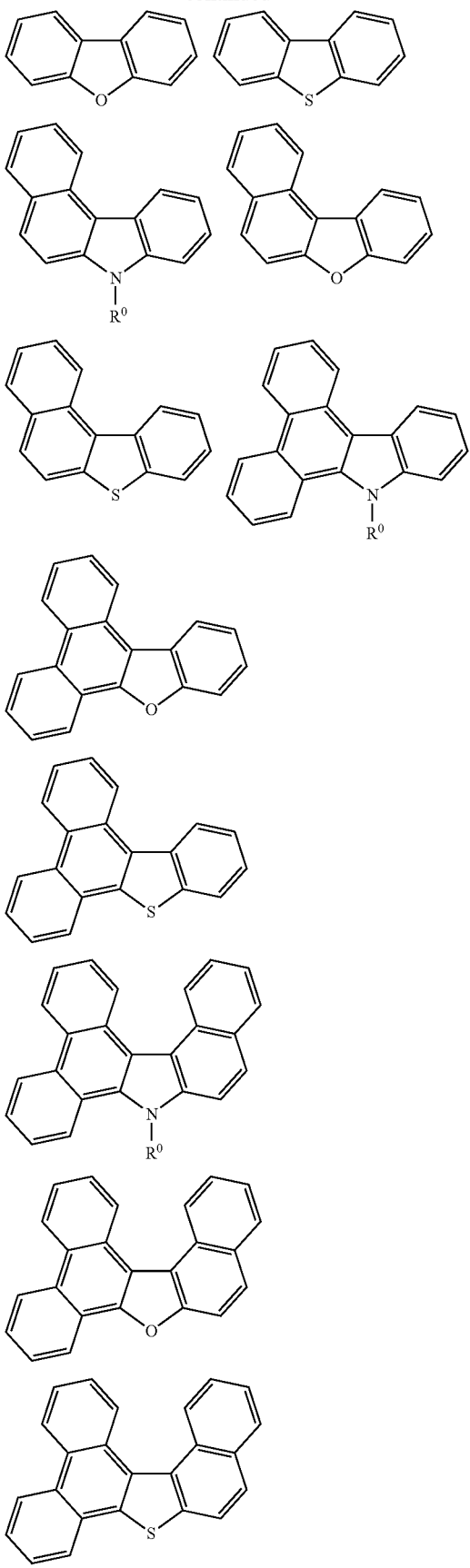

wherein, in the above compounds, M may be a substituted or unsubstituted C1 to C5 alkylene group, —O—, —S—, —SO$_2$—, or carbonyl, and R$^0$ and R$^1$ may each independently be hydrogen, a hydroxy group, a methoxy group, an ethoxy group, a halogen atom, a halogen-containing group, a substituted or unsubstituted C1 to C30 alkyl group, a substituted or unsubstituted C6 to C30 aryl group, or a combination thereof.

In Chemical Formula 1, A$^1$ may be a group that is substituted with a hydroxy group, a thionyl group, a thiol group, a cyano group, an amino group, a C1 to C10 alkyl group, a C6 to C30 aryl group, a C1 to C30 alkoxy group, or a combination thereof.

The polymer may further include a structural unit represented by Chemical Formula 2:

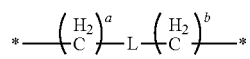

wherein, in Chemical Formula 2, A$^2$ may be a divalent cyclic group including at least one of a substituted or unsubstituted benzene ring, and B$^1$ and * may be defined the same as those of Chemical Formula 1, and wherein the structural unit represented by Chemical Formula 2 may be different from the structural unit represented by Chemical Formula 1.

In Chemical Formula 1, B$^1$ may be represented by Chemical Formula 3:

[Chemical Formula 3]

$$*-\left(\begin{matrix}H_2\\C\end{matrix}\right)_a-L-\left(\begin{matrix}H_2\\C\end{matrix}\right)_b-*$$

wherein, in Chemical Formula 3, a and b may each independently be an integer of 0 to 2, and L may be a substituted or unsubstituted divalent cyclic group of one of the following compounds,

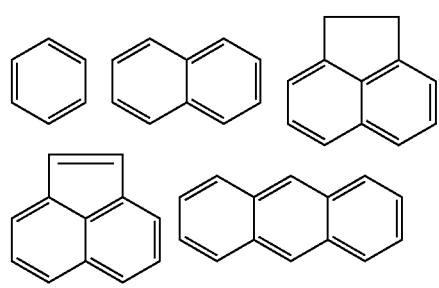

-continued

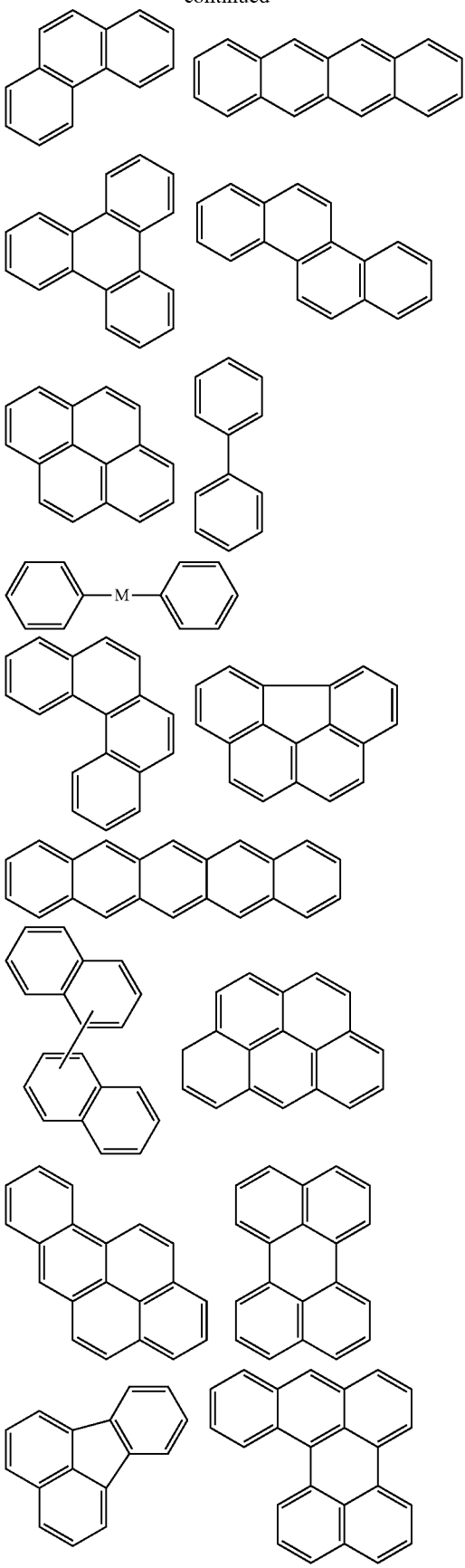

wherein, in the above compounds, M may be a substituted or unsubstituted C1 to C5 alkylene group, —O—, —S—, —SO₂—, or carbonyl.

The polymer may have a weight average molecular weight of about 500 to about 200,000.

The curing after applying the second composition may be performed at a temperature that is higher than a temperature at which the curing after applying the first composition is performed.

The first composition and the second composition may each independently include a surfactant, a plasticizer, a cross-linking agent, a thermal acid generator, a photoacid generator, or a combination thereof.

The cross-linking agent may include methoxymethylated glycoluril, butoxymethylated glycoluril, methoxymethylated melamine, butoxymethylated melamine, methoxymethylated benzoguanamine, butoxymethylated benzoguanamine, methoxymethylated urea, butoxymethylated urea, methoxymethylated thiourea, butoxymethylated thiourea, methoxymethylatedbenzene, butoxymethylated benzene, methoxymethylated phenol, butoxymethylated phenol, or a combination thereof.

The solvent of the first composition and the solvent of second composition may each independently include propylene glycol, propylene glycol diacetate, methoxy propanediol, diethylene glycol, diethylene glycol butylether, tri(ethylene glycol)monomethylether, propylene glycol monomethylether, propylene glycol monomethylether acetate, cyclohexanone, ethyllactate, gamma-butyrolactone, N,N-dimethyl formamide, N,N-dimethyl acetamide, methylpyrrolidone, methylpyrrolidinone, acetylacetone, ethyl 3-ethoxypropionate, or a combination thereof.

Coating the first composition may include applying the first composition to a thickness of about 300 Å to about 10 μm, and coating the second composition may include applying the second composition to a thickness of about 300 Å to about 10 μm.

One side of the substrate may have a first part having a pattern thereon and a second part without a pattern thereon, and a sum of step differences of the second organic layer may be smaller than a sum of step differences of the first organic layer.

The embodiments may be realized by providing a method of forming a pattern, the method including providing a layer structure produced according to the method of an embodiment; forming a silicon-containing thin layer on the layer structure; forming a photoresist layer on the silicon-containing thin layer; exposing and developing the photoresist layer to form a photoresist pattern; and selectively removing the silicon-containing thin layer and the first organic layer, the second organic layer, or a combination thereof in the layer structure using the photoresist pattern.

The method may further include forming a bottom anti-reflective coating prior to forming the photoresist.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
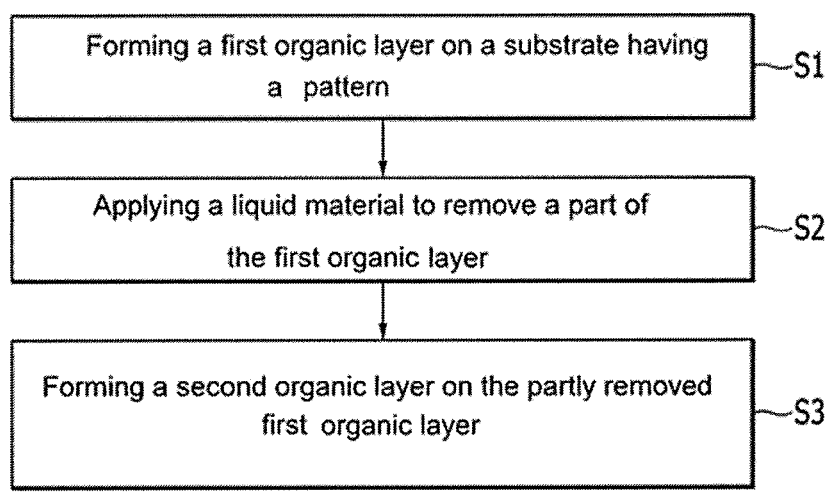
FIG. 1 illustrates a flowchart of a method of producing a layer structure according to one embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

It will be understood that when a layer is referred to as being "between" two layers, it can be the only layer between the two layers, or one or more intervening layers may also be present.

In the drawings, the thickness of layers, films, panels, regions, etc., may be exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

As used herein, any singular form includes a plural form unless there is no particularly mention. As used herein, the terms "comprise," "include," "including," and/or "comprising" refer to presence of said feature, integer, step, operation, constituent element, and/or component but does not exclude addition of more than one other features, integers, steps, operations, constituent elements, components, and/or a combination thereof.

As used herein, when a definition is not otherwise provided, the term 'substituted' may refer to one substituted with or including a substituent selected from a halogen atom (e.g., F, Br, Cl, or I), a hydroxy group, an alkoxy group, a nitro group, a cyano group, an amino group, an azido group, an amidino group, a hydrazino group, a hydrazono group, a carbonyl group, a carbamyl group, a thiol group, ester group, a carboxyl group or a salt thereof, a sulfonic acid group or a salt thereof, phosphoric acid or a salt thereof, a C1 to C20 alkyl group, a C2 to C20 alkenyl group, a C2 to C20 alkynyl group, a C6 to C30 aryl group, a C7 to C30 arylalkyl group, a C1 to C30 alkoxy group, a C1 to C20 heteroalkyl group, a C2 to C20 heteroaryl group, a C3 to C20 heteroarylalkyl group, a C3 to C30 cycloalkyl group, a C3 to C15 cycloalkenyl group, a C6 to C15 cycloalkynyl group, C2 to C30 heterocycloalkyl group, and a combination thereof, instead of hydrogen of a compound.

As used herein, when a definition is not otherwise provided, the term 'hetero' may refer to one including 1 to 3 heteroatoms selected from N, O, S, and P.

As used herein, "a monovalent group derived from' or "a monovalent group of" a compound A indicates a monovalent group formed by replacing or removing one hydrogen in the compound A to form a bonding location. For example, a monovalent group derived from or monovalent group of benzene may be a phenyl group. In addition, "a divalent group derived from" or "a divalent group of" a compound A indicates a divalent group having two linking points or bonding locations formed by replacing or removing two hydrogens in the compound A. For example, the divalent group derived from or divalent group of benzene may be a phenylene group.

Hereinafter, a method of producing a layer structure according to an embodiment is described referring to FIG. 1.

FIG. 1 is a flowchart explaining a method of producing a layer structure according to one embodiment.

Referring to FIG. 1, the method of producing a layer structure may include coating a first composition on a substrate having a pattern, e.g., plurality of patterns, thereon and curing the coated first composition to form a first organic layer (S1). The method may further include applying a liquid material to the first organic layer to remove a part of the first organic layer (S2). The method may further include coating a second composition on the first organic layer (after the partial removal), and curing the coated second composition to form a second organic layer (S3).

In the formation of the first organic layer (S1), the substrate may be, e.g., a silicon wafer, a glass substrate, or a polymer substrate. In an implementation, the substrate may be obtained by disposing silicon oxide, silicon nitride, TiSi, silicide, polysilicon tungsten, copper, aluminum, TiN, TaN, or a combination thereof on the glass substrate or the polymer substrate.

The substrate may have a pattern, e.g., plurality of patterns, on one side, and the pattern may have a suitable shape, e.g., a triangle, a quadrangle, a circle, or the like. The may have a suitable size, e.g., may have an average size (a horizontal length, or a width) of several nanometers to hundreds of nanometers and/or an average size (a vertical length, or a depth) of several nanometers to tens of micrometers. As used herein, 'a gap of patterns' or 'inside gaps of patterns' indicates an empty space formed between a first pattern and a second pattern neighboring the first pattern, and gaps of a plurality of patterns may for example have an average size (a horizontal length) of several nanometers to hundreds of nanometers, and the patterns may for example have an average size (a vertical length) of several nanometers to tens of micrometers.

In the formation of the first organic layer (S1), the first composition may be cured by applying energy thereto. The energy may include a suitable form that is capable of curing the first composition, e.g., ultraviolet (UV), a microwave, a sound wave, an ultrasonic wave, or the like. The curing may further charge the first composition in the gaps in the pattern or between the plurality of patterns.

In an implementation, the curing of the first composition may be performed at, e.g., about 20 to about 400° C.

Hereinafter, the first composition is described.

The first composition may include a solvent and a polymer that includes a structural unit represented by Chemical Formula 1.

   [Chemical Formula 1]

In Chemical Formula 1, $A^1$ may be a divalent cyclic group that includes at least one of a substituted or unsubstituted benzene ring.

$B^1$ may be a divalent organic group. * is a linking point.

The polymer may include a plurality of structural units represented by Chemical Formula 1 and each structural unit of the plurality of structural units may be the same or different. In an implementation, the polymer may include a random, ordered, repeating, etc. arrangement of the groups of $A^1$ and $β^1$ therein.

In an implementation, in Chemical Formula 1, $A^1$ may be a substituted or unsubstituted divalent cyclic group of one of the following compounds.

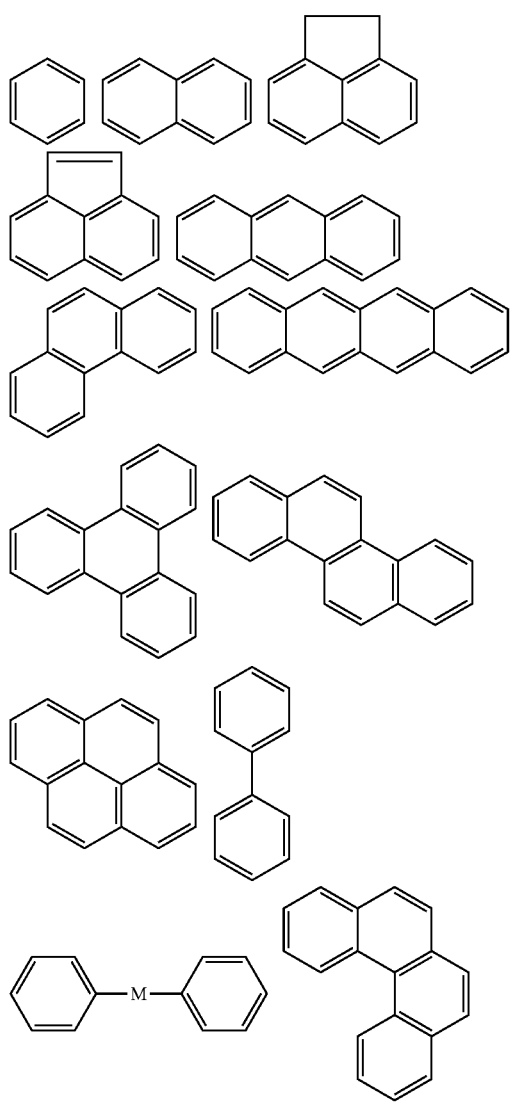

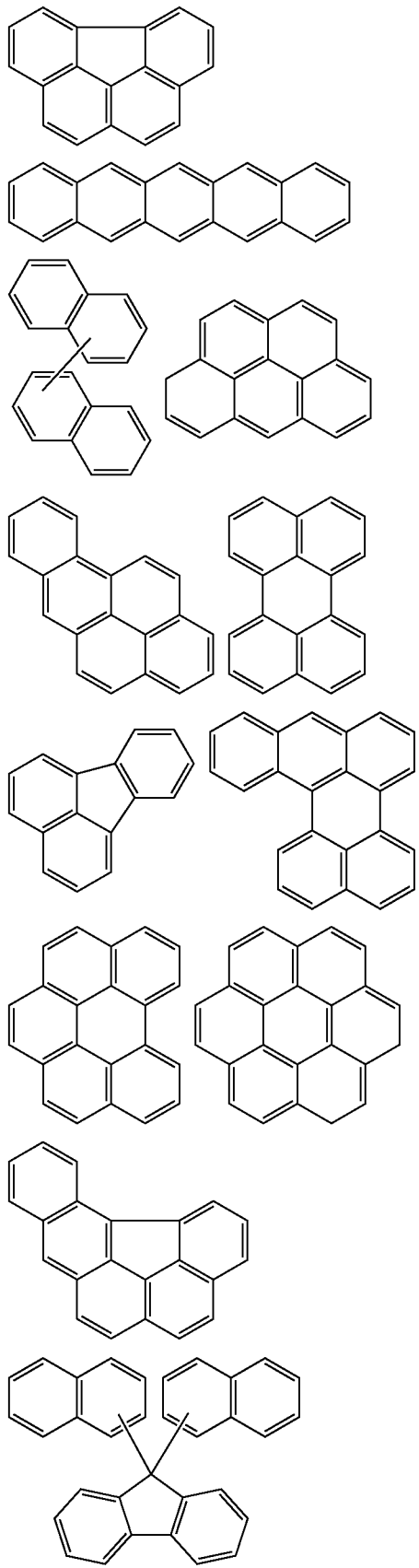

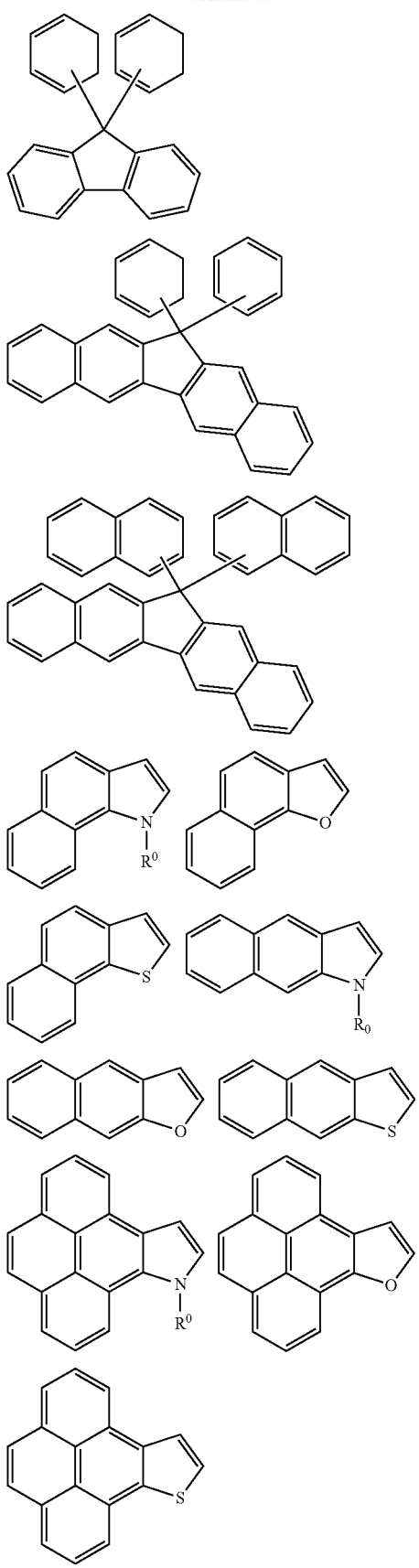
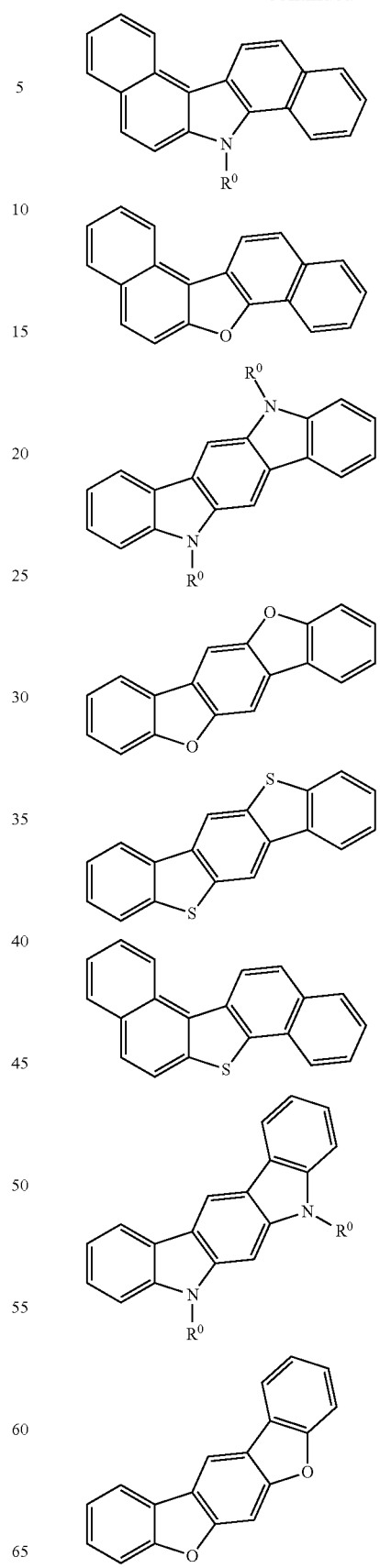

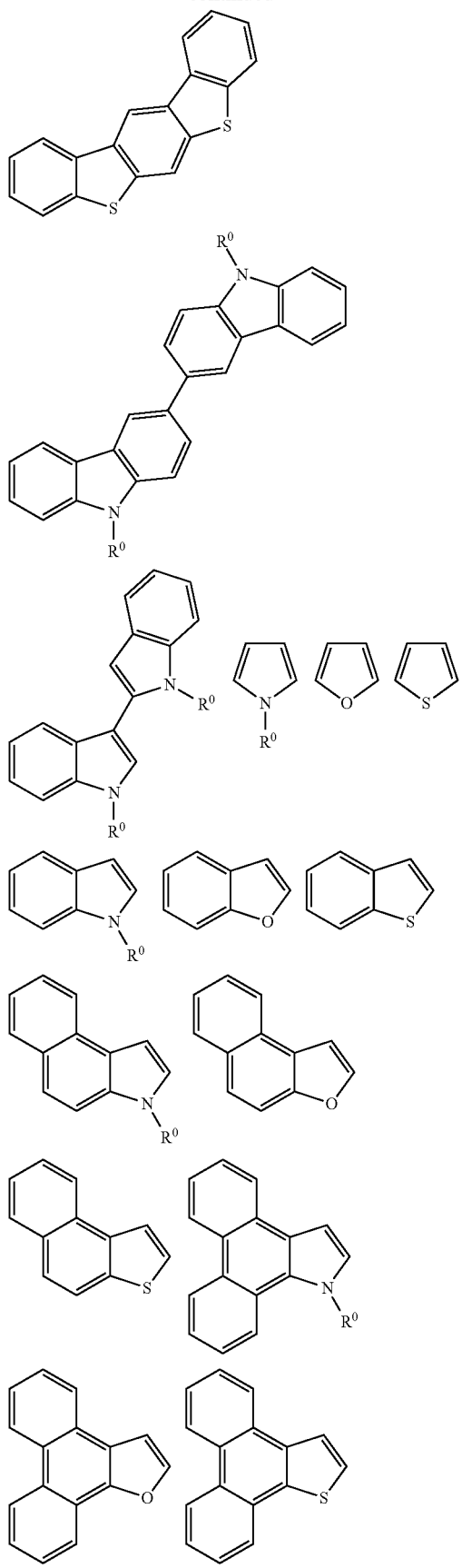
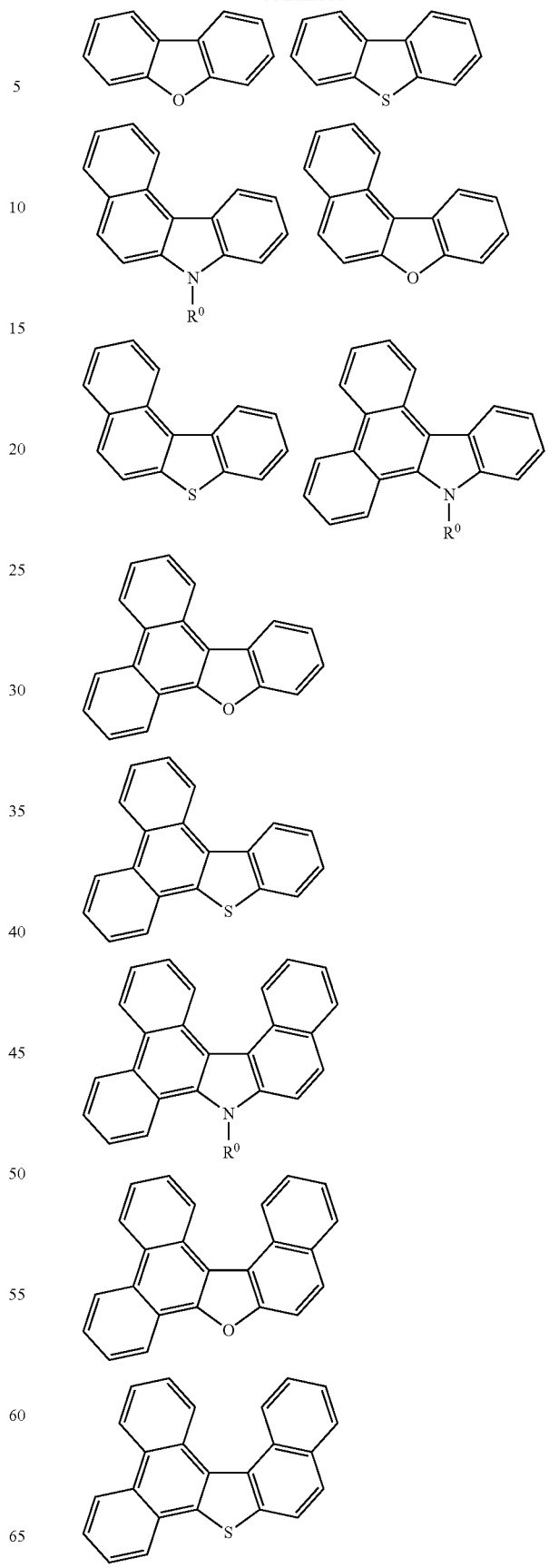

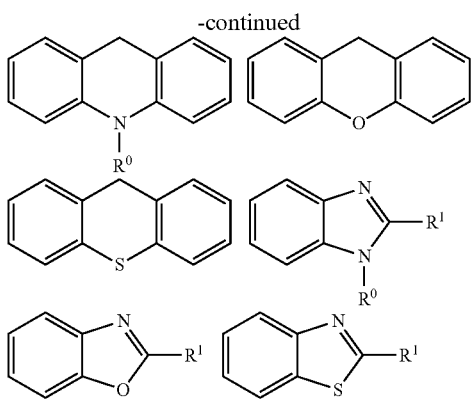

In the above compounds, M may be or may include, e.g., a substituted or unsubstituted C1 to C5 alkylene group, —O—, —S—, —SO$_2$—, or carbonyl.

R$^0$ and R$^1$ may each independently be or include, e.g., hydrogen, a hydroxy group, a methoxy group, an ethoxy group, a halogen atom, a halogen-containing group, a substituted or unsubstituted C1 to C30 alkyl group, a substituted or unsubstituted C6 to C30 aryl group, or a combination thereof.

In the groups of the above compounds, linking points or bonding locations may be at suitable locations on the group.

In an implementation, R$^1$ may be or may include, e.g., a substituted or unsubstituted phenyl group.

In an implementation, in Chemical Formula 1, A$^1$ may be a divalent cyclic group including at least two rings in is structure. For example, etch resistance of the first organic layer may further improved.

In Chemical Formula 1, A$^1$ may be a divalent cyclic group of one of the above compounds wherein at least one hydrogen is substituted, e.g., replaced with a substituent. In an implementation, properties of the first composition may be controlled by selecting kinds and the number of substituents, and the substituent (e.g., functional group) may be selected from or include, e.g., a hydroxy group, a halogen atom, a halogen-containing group, a thionyl group, a thiol group, a cyano group, a substituted or unsubstituted amino group, a substituted or unsubstituted C1 to C30 alkyl group, a substituted or unsubstituted C3 to C30 cycloalkyl group, a substituted or unsubstituted C6 to C30 aryl group, a substituted or unsubstituted C3 to C30 cycloalkenyl group, a substituted or unsubstituted C1 to C20 alkylamine group, a substituted or unsubstituted C7 to C20 arylalkyl group, a substituted or unsubstituted C1 to C20 heteroalkyl group, a substituted or unsubstituted C2 to C30 heterocycloalkyl group, a substituted or unsubstituted C2 to C30 heteroaryl group, a substituted or unsubstituted C1 to C30 alkoxy group, a substituted or unsubstituted C2 to C30 alkenyl group, a substituted or unsubstituted C2 to C30 alkynyl group, a substituted or unsubstituted C1 to C20 aldehyde group, a substituted or unsubstituted C 1 to C4 alkyl ether, a substituted or unsubstituted C7 to C20 arylalkylene ether, a substituted or unsubstituted C1 to C30 haloalkyl group, a substituted or unsubstituted C1 to C20 alkylborane group, and a substituted or unsubstituted C6 to C30 arylborane group.

In an implementation, in Chemical Formula 1, A$^1$ may be a group where at least one hydrogen is replaced with a hydroxy group, a thionyl group, a thiol group, a cyano group, an amino group, a C1 to C10 alkyl group, a C6 to C30 aryl group, a C1 to C30 alkoxy group, or a combination thereof.

In an implementation, the polymer of the first composition may further include a structural unit represented by Chemical Formula 2. For example, the structural unit represented by Chemical Formula 2 may be different from the structural unit represented by Chemical Formula 1.

In Chemical Formula 2, A$^2$ may be a divalent cyclic group that includes at least one of a substituted or unsubstituted benzene ring.

B$^1$ and * may be the same as defined in Chemical Formula 1.

The polymer may be, e.g., synthesized by ternary copolymerization by including the structural unit represented by Chemical Formula 1 and the structural unit represented by Chemical Formula 2. In an implementation, in Chemical Formulae 1 and 2, A$^1$ and A$^2$ may be a different group.

In an implementation, in Chemical Formulae 1 and 2, each B$^1$ (as a linking group) may independently be represented by Chemical Formula 3.

[Chemical Formula 3]

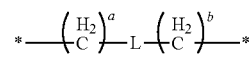

In Chemical Formula 3, a and b may each independently be an integer of 0 to 2.

L may be a substituted or unsubstituted divalent cyclic group of one of the following compounds.

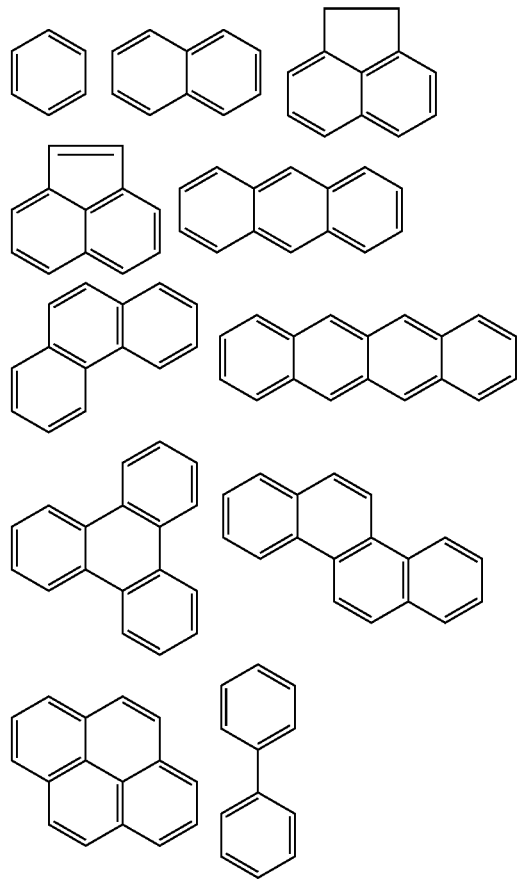

-continued

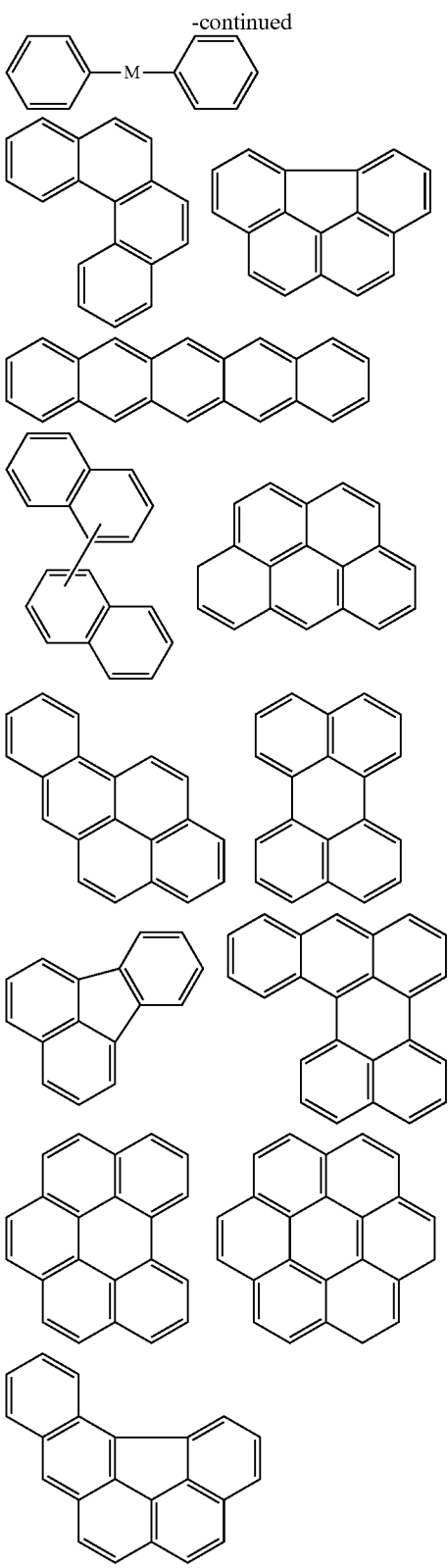

In the above compounds, M may be or may include, e.g., a substituted or unsubstituted C1 to C5 alkylene group, —O—, —S—, —SO$_2$—, or carbonyl. A linking point of L in Chemical Formula 3 may be at a suitable bonding location on the group.

The solvent of the first composition may be a suitable solvent having sufficient solubility or dispersibility for the polymer of the first composition. The solvent may include, e.g., at least one selected from propylene glycol, propylene glycol diacetate, methoxy propanediol, diethylene glycol, diethylene glycol butylether, tri(ethylene glycol)monomethylether, propylene glycol monomethylether, propylene glycol monomethylether acetate, cyclohexanone, ethyllactate, gamma-butyrolactone, N,N-dimethyl formamide, N,N-dimethyl acetamide, methylpyrrolidone, methylpyrrolidinone, acetylacetone, and ethyl 3-ethoxypropionate.

The polymer of the first composition may be included in an amount of about 0.1 wt % to about 60 wt %, based on a total weight of the first composition. When the polymer is included in the range, a thickness, surface roughness, and planarization of the first organic layer may be controlled.

The first composition may further include an additive, e.g., a surfactant, a plasticizer, a cross-linking agent, a thermal acid generator (TAG), or a photoacid generator (PAG).

The surfactant may include, e.g., alkylbenzene sulfonate salt, alkyl pyridinium salt, polyethylene glycol, or a quaternary ammonium salt.

The plasticizer may include, e.g., DOP (dioctylphthalate), DOA (dioctyladipate), TCP (tricresyl phosphate), DIOP (Diisocctyl phthalate), DL79P (diheptyl, nonyl phthalate) DINP (diisononyl phthalate), DUP (diunedcyl phthalate), BBP (butyl benzyl phthalate), DOA (di-2-ethyl hexyl adipate), DIDA (diisodecyl adipate), DOZ (di-2-ethylhexyl Sebacate), DIOZ (Diisooctyl Azelate), DOS (Di-2-ethylhexyl Sebacate), TOP (tri-2ethylhexyl phosphate), TTP (triphenyl phosphate), CDP (cresyldephenyl phosphate), TCP (tircresyl phosphate), TXP (trixylyl phosphate), TOTM (tri-2-ethylhexyl trimellitate), polyethylene gpycol ester, ASE (alkylsulphonic acid phenyl ester), 3G6 (triethylene glycol dihexanoate), 4g7 (tetraethylene glycol diheptanoate), ATEC (acetyl triethyl citrate), TBC (tributyl citrate), TOC (trioctyl citrate), ATOC (acetyl trioctyl citrate), ATHC (acetyl trihexyl citrate), TMC (trimethyl citrate), DMAD (dimethyl adipate, MMAD (monomethyl adipate), DBM (dibutyl maleate), DIBM (diisobutyl maleate), BDNPF (bis (2,2-dinitropropyl)formal), TNEN (2,2,2-trinitroethyl 2-nitroxyethyl ether) polyethylene glycol, polypropylene, or a combination thereof.

The cross-linking agent may include, e.g., a melamine-based agent, a substituted urea-based agent, or a polymer-based agent thereof. In one embodiment, a cross-linking agent having at least two cross-linking forming substituent may include, e.g., a compound such as methoxymethylated glycoluril, butoxymethylated glycoluril, methoxymethylated melamine, butoxymethylated melamine, methoxymethylated benzoguanamine, butoxymethylated benzoguanamine, methoxymethylated urea, butoxymethylated urea, methoxymethylated thiourea, butoxymethylated thiourea, methoxymethylatedbenzene, butoxymethylated benzene, methoxymethylated phenol, butoxymethylated phenol, or a combination thereof.

The cross-linking agent may be a cross-linking agent having high heat resistance. The cross-linking agent having high heat resistance nay be a compound including a cross-linking substituent including an aromatic ring (for example a benzene ring, or a naphthalene ring) in the molecule.

The thermal acid generator may include, e.g., an organic sulfonic acid alkylester compound such as benzointosylate and 2-nitro benzyl tosylate, an onium salt compound such as diphenyliodonium trifluoromethane sulfonate, diphenyliodonium dodecyl benzenesulfonate, bis (4-tert-butyl phenyl) iodonium Camphor sulfonate, bis (4-tert-butyl phenyl) iodonium nonafluoro n-butane sulfonate, bis (4-tert-butyl phenyl) iodonium trifluoromethane sulfonate, and an onium salt compound such as triphenylsulfonium trifluoromethane sulfonate. In addition, 2,4,4,6-tetra bromo cyclohexadienone, phenyl-bis(trichloro methyl)-s-triazine and N-hydroxysuccinimide trifluoromethane sulfonate, pyridinium p-toluenesulfonate, or a combination thereof may be used.

Examples of the photoacid generator may include triphenylsulfonium triflate, triphenylsulfonium antimonate, diphenyliodonium triflate, diphenyliodonium antimonate, methoxydiphenyliodonium triflate, di-t-butyldiphenyliodonium triflate, 2,6-dinitrobenzyl sulfonates, pyrogallol tris (alkylsulfonates), N-hydroxysuccinimide triflate, norbornene-dicarboximide-triflate, triphenylsulfonium nonaflate, diphenyliodonium nonaflate, methoxydiphenyliodonium nonaflate, di-t-butyldiphenyliodonium nonaflate, N-hydroxysuccinimide nonaflate, norbornene-dicarboximide-nonaflate, triphenylsulfonium perfluorobutanesulfonate, triphenylsulfonium perfluorooctanesulfonate, diphenyliodonium PFOS, methoxydiphenyliodonium PFOS, di-t-butyldiphenyliodonium triflate, N-hydroxysuccinimide PFOS, norbornene-dicarboximide PFOS, or a combination thereof.

The additive may be used in a suitable amount range that does not change optical properties of the first composition and still improves gap-fill and etch performance as well as solubility. In an implementation, the additive may be included in an amount of, e.g., about 0.001 to about 40 parts by weight, based on 100 parts by weight of the first composition.

The first composition may be disposed or provided using a method of, e.g., screen printing, slit coating, dipping, inkjet, casting, and spraying as well as spin-on coating. In an implementation, the first composition may be applied to have a thickness of, e.g., about 300 Å to about 10 μm.

Then, the partial removal of the first organic layer (S2) may be performed.

The first organic layer may be partially dissolved and removed by application of a liquid material and may thus be planarized.

The liquid material may include a suitable material that is capable of dissolving an organic compound included in the first organic layer. For example, the liquid material may be an organic solvent.

In an implementation, the liquid material may include, e.g., γ-butyrolactone, δ-valerolactone, ethyl lactate, ethyl-3-ethoxypropionate, propylene glycol mono methylether acetate, β-hydroxy β-methylbutyrate, or a combination thereof.

In an implementation, the liquid material may include, e.g., an alcohol based solvent such as methanol, ethanol, 1-propyl alcohol, 2-propyl alcohol, 2-butanol, ethylene glycol, propylene glycol, glycerol, 1,6-hexanediol, cyclo hexanediol, sorbitol, xylitol, 2-methyl-2,4-pentanediol, 1,3-butanediol, and 1,4-butanediol.

In an implementation, the liquid material may include, e.g., an ether based solvent such as ethylene glycol monomethyl ether, diethylene glycol, dipropylene glycol, propylene glycol monomethyl ether, diethylene glycol monomethyl ether, triethylene glycol, poly(ethylene glycol), propylene glycol monomethyl ether, dipropylene glycol monomethyl ether, tripropylene glycol monomethyl ether, diethylene glycol monobutyl ether and diethylene glycol monobutyl ether.

In an implementation, the liquid material may include, e.g., an ester based solvent such as propylene glycol monomethyl ether acetate, ethylethoxy propionate, propylene glycol monomethyl ether propionate, ethylene glycol diacetate, ethyl lactate, butyl lactate, methyl 2-hydroxyisobutyrate, n-butyl acetate, and the like.

In an implementation, the liquid material may include, e.g., an amide based solvent such as formamide, monomethylformamide, dimethyl formamide, acetamide, monomethylacetamide, dimethyl acetamide, monoethylacetamide, diethylacetamide, and N-methylpyrrolidone.

In an implementation, the liquid material may include, e.g., an alkoxy alkyl propionate based solvent such as methoxy methyl propionate, methoxy ethyl propionate, methoxy propyl propionate, methoxy butyl propionate, ethoxy methyl propionate, ethoxy ethylpropionate, ethoxy propyl propionate, and ethoxy butyl propionate.

In an implementation, the liquid material may include, e.g., a sulfur-containing solvent such as dimethyl sulfone, dimethyl sulfoxide and sulfolane.

In an implementation, the liquid material may include, e.g., a ketone-based solvent such as acetone, acetyl acetone, methylethyl ketone, and methyl isobutyl ketone.

In an implementation, the liquid material may be applied in an amount of about 0.1 cc to about 100 cc, e.g., about 0.1 cc to about 50 cc, about 0.1 cc to about 10 cc, about 0.1 cc to about 5 cc.

In an implementation, the liquid material may be dispensed on the first organic layer using a method of, e.g., spin-on coating, screen printing, slit coating, dipping, inkjet, casting, or spray coating. In an implementation, the method may be repeated about 1 to about 10 times with a view toward the desired removal degree of the first organic layer. A speed and frequency of the dispensing may be appropriately selected in consideration of properties of the first composition, the substrate material, the pattern size, and the like.

After partially removing the first organic layer (S2), the first organic layer may remain inside a gap of the pattern. The first organic layer remaining after the partial removal of the first organic layer (S2) may be present partially or all over an interior of the gap of the pattern.

Then, formation of a second organic layer (S3) may be performed by applying a second composition on the first organic layer remaining after the partial removal and the curing the second composition.

The second composition may be applied on the parts of the first organic layer that remain after partially removing the first organic layer.

The second composition may include a solvent and a polymer including the structural unit represented by Chemical Formula 1.

For example, the polymer and the solvent included in the second composition may be the same as the aforementioned polymer and solvent included in the first composition. For example, a kind of the polymer and/or the solvent included in the first composition may be the same as or different from a kind of the polymer and/or the solvent included in the second composition. For example, the second composition may be the same as the first composition or may be different from the first composition.

The second organic layer may be formed directly on the first organic layer after the partial removal of the first organic layer, and the first and second organic layers may together become or form, e.g., a hardmask layer.

The hardmask layer may be formed of a polymer including the structural unit represented by Chemical Formula 1 and thus may have excellent solubility in a solvent as well as excellent etch resistance, and may be advantageously formed using a spin-on coating method.

The polymer of the second composition may be included in an amount of about 0.1 wt % to about 60 wt %, based on a total weight of the second composition. When the polymer is included in the range, a thickness, surface roughness, and planarization of the second organic layer may be controlled.

The second composition may further include an additive, e.g., a surfactant, a plasticizer, a cross-linking agent, a thermal acid generator (TAG), or a photoacid generator (PAG), and the kinds and amounts of the additive may be the same as the first composition.

The second composition may be formed to be, e.g., about 300 Å to about 10 μm thick using a spin-on coating method.

The second composition may be applied and then cured to provide a second organic layer.

The curing after applying the second composition may include applying energy to a layer structure having the applied second composition. The energy may include a suitable form of energy that is capable of curing the second composition, e.g., photo energy, heat energy, and the like. The second organic layer formed through the curing may be a hardmask composition carbonization layer or a sacrificial layer in the following process of forming a pattern. For example, the curing after applying the second composition may be performed at a higher temperature than the curing after applying the first composition. The curing of the second composition may include a first curing at about 20 to about 400° C. and a second curing at about 30 to about 500° C., and the second curing temperature may be higher than the first curing temperature.

Figure 2:
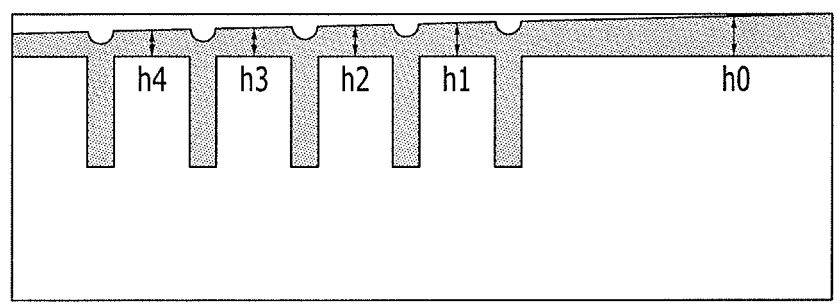
FIG. 2 illustrates a cross-sectional view showing steps of a first organic layer.

FIG. 2 illustrates a cross-sectional view showing steps of the aforementioned first organic layer. Referring to FIG. 2, the first composition may be charged inside a gap, and a concavo-convex may remain on a part of the surface of a first organic layer. For example, an upper surface of the first organic layer may be inclined and/or may include concave recesses or dips corresponding with or overlying gaps in the pattern.

Figure 3:
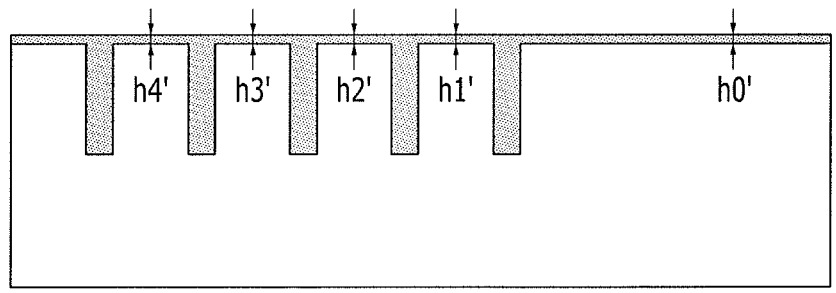
FIGS. 3 to 5 illustrate cross-sectional views showing states in which a part of the first organic layer in FIG. 2 is removed.
Figure 4:
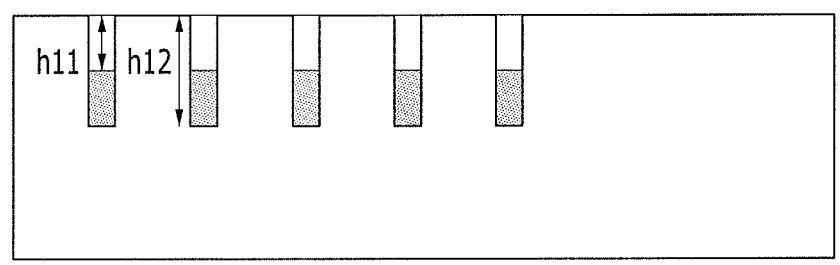
Figure 5:
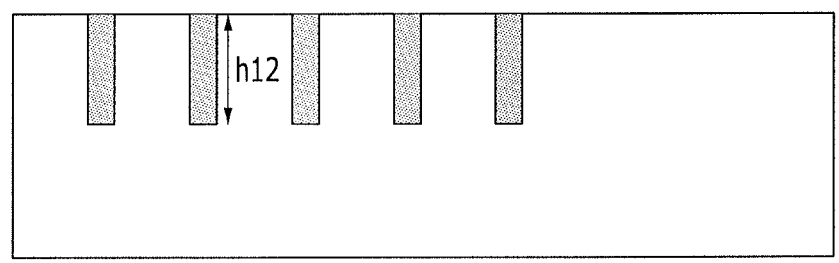

FIGS. 3 to 5 illustrate cross-sectional views showing different states in which the first organic layer of FIG. 2 is partially removed. The first organic layer after partial removal may have a surface layer structure as shown in FIG. 3, such that the first organic layer may remain on a pattern region having a pattern and a non-pattern region. As shown in FIG. 4, the first organic layer may remain to be partially charged in the gap of pattern (h12>h11≥0). As shown in FIG. 5, the first organic layer may be fully charged in the gap of the pattern and not on the non-pattern region.

The layer structure formed by the aforementioned method may minimize a step generation on the surface.

Figure 6:
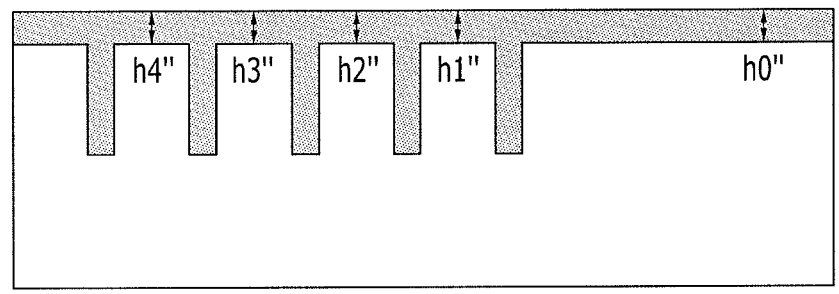
FIG. 6 illustrates a cross-sectional view showing steps of a second organic layer.

FIG. 6 illustrates a cross-sectional view showing steps of the second organic layer after having been formed on the partially removed first organic layer according to an exemplary embodiment.

Referring to FIGS. 2 and 6, a sum of step differences on the surface of the layer structure in a second organic layer state, e.g., |h0"−h1"|+|h0"−h2"|+|h0"−h3"|+|h0"−h4"| may be smaller than a sum of step differences on the surface of the layer structure in a first organic layer state without a treatment with a planarization process, e.g., without or prior to the partial removal, e.g., |h0−h1|+|h0−h2|+|h0−h3|+|h0−h4|. For example, a final layer structure after the planarization process by using the liquid material shows improved planarization characteristics.

According to another embodiment, a layer structure produced by the producing method is provided.

In the layer structure, the first organic layer and the second organic layer may be a hardmask layer. The hardmask layer may have excellent planarization characteristics and thus may help minimize critical dimension (CD) errors of patterns in the following pattern-forming process and may help improve CD uniformity of the patterns.

Hereinafter, a method of forming patterns according to another embodiment is illustrated referring to FIGS. 7 to 9.

Figure 7:
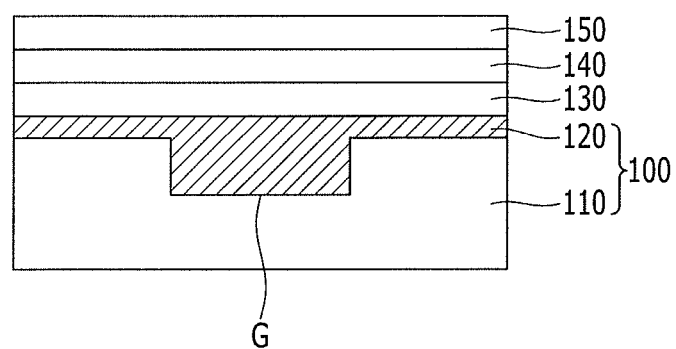
FIGS. 7 to 9 illustrate cross-sectional views of stages in a method of forming a pattern according to an embodiment.
Figure 8:
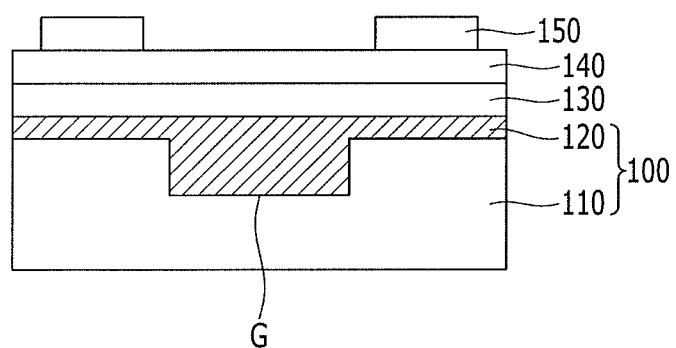
Figure 9:
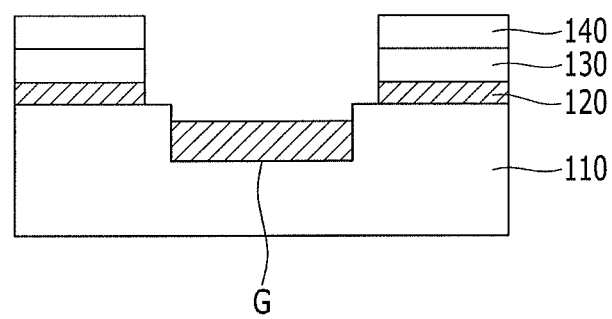

FIGS. 7 to 9 illustrate cross-sectional views of stages in a method of forming patterns according to one embodiment.

The method of forming patterns may include providing a layer structure produced according to the producing method described above; forming a silicon-containing thin layer on the layer structure; forming a photoresist layer on the silicon-containing thin layer; exposing and developing the photoresist layer to form a photoresist pattern; and selectively removing the silicon-containing thin layer and the first organic layer, the second organic layer, or a combination thereof in the layer structure using the photoresist pattern.

Referring to FIG. 7, an organic layer 120 may be the aforementioned first organic layer and/or second organic layer and formed on a substrate 110 and charge a gap (G) in a pattern. On a layer structure 100, a silicon-containing thin layer 130 and a photoresist layer 150 may be sequentially formed, and a bottom antireflective coating (BARC) 140 may be formed before forming the photoresist layer 150. In an implementation, a material layer on the substrate may be formed before forming the first organic layer. The material layer may be a material to be finally patterned, e.g., a metal layer such as an aluminum layer and a copper layer, a semiconductor layer such as a silicon layer, or an insulation layer such as a silicon oxide layer and a silicon nitride layer. The material layer may be formed through a method such as a chemical vapor deposition (CVD) process.

For example, the silicon-containing thin layer 130 may be SiCN, SiOC, SiON, SiOCN, SiC, SiN, or a combination thereof.

Referring to FIG. 8, the photoresist layer may be exposed and developed to form a photoresist pattern. Exposure of the photoresist layer may be performed using, e.g., ArF, KrF, or EUV. After exposure, heat treatment may be performed at about 100° C. to about 500° C.

Referring to FIG. 9, the silicon-containing thin layer 130 and the organic layer 120 in the layer structure may be selectively removed. Before forming an organic layer 120, a material layer may be formed, the silicon-containing thin layer 130 and the organic layer 120 in the layer structure may be selectively removed and thereby the exposed material layer may be etched.

The etched material layer may be formed in a pattern, and the pattern may include, e.g., a metal pattern, a semiconductor pattern, an insulation pattern, or the like, (for example diverse patterns of a semiconductor integrated circuit device).

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

SYNTHESIS EXAMPLES

Synthesis Example 1

16 g of phenanthren-9-ol, 16 g of 1,3-bis(2-methoxyethyl)benzene, 0.46 g of diethylsulfate, and 61 g of propylene glycol monomethyl ether acetate (PGMEA) were put in a flask and then stirred at 100° C. for 2 to 15 hours, performing a polymerization reaction. When a polymer had a weight average molecular weight of 2,000 to 3,500, the reaction was complete. When the polymerization reaction was complete, the reactant was slowly cooled down to ambient temperature and then added to 40 g of distilled water and 400 g of methanol, and the mixture was stirred and allowed to stand. After removing a supernatant therefrom, a precipitate therein was dissolved in 80 g of propylene glycol monomethyl ether acetate (PGMEA), and the solution was stirred in 320 g of methanol and 320 g of water and allowed to stand (a primary process). Herein, after removing a supernatant obtained therefrom again, a precipitate therein was dissolved again in 80 g of propylene glycol monomethyl ether acetate (PGMEA) (a secondary process). The primary and secondary processes were regarded as one purification process, and this purification process was performed a total of three times. The purified polymer was dissolved in 80 g of propylene glycol monomethyl ether acetate (PGMEA), and the methanol and the distilled water remaining in the solution were removed under a reduced pressure, obtaining a polymer (Mw: 3,700) including a structural unit represented by Chemical Formula 1a.

[Chemical Formula 1a]

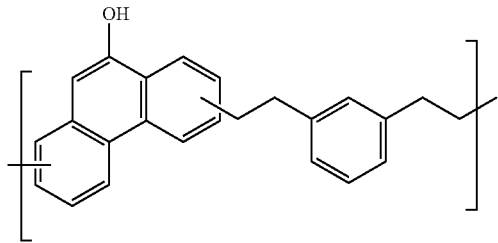

Synthesis Example 2

A polymer (Mw: 3,500) including a structural unit represented by Chemical Formula 2a was obtained according to the same synthesis as Synthesis Example 1 except for using 18 g of anthracene, 26 g of 1,4-bis(methoxymethyl)benzene, 66 g of propylene glycol monomethyl ether acetate (PGMEA), and 0.5 g of diethylsulfate.

[Chemical Formula 2a]

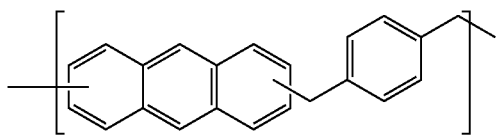

Synthesis Example 3

A polymer (Mw: 3,500) including a structural unit represented by Chemical Formula 3a was obtained according to the same synthesis as Synthesis Example 1 except for using 38 g of 4,4'-(9H-fluorene-9,9-diyl)diphenol, 17 g of 1,4-bis(methoxymethyl)benzene, 82 g of propylene glycol monomethyl ether acetate (PGMEA), and 0.5 g of diethylsulfate.

[Chemical Formula 3a]

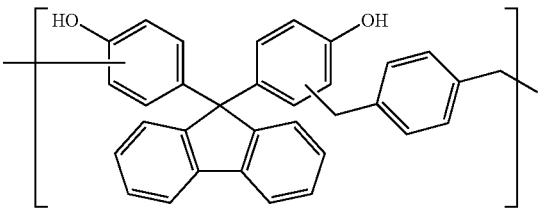

Synthesis Example 4

A polymer (Mw: 3,500) including a structural unit represented by Chemical Formula 4a was obtained according to the same synthesis as Synthesis Example 1 except for using 48 g of pyrocatechol, 17 g of 1,3-bis(methoxymethyl)benzene, 98 g of propylene glycol monomethyl ether acetate (PGMEA), and 0.5 g of diethylsulfate.

[Chemical Formula 4a]

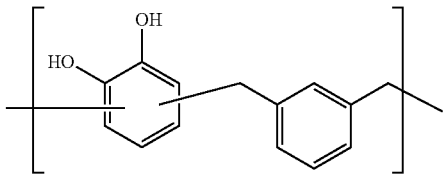

Synthesis Example 5

A polymer (Mw: 3,000) including a structural unit represented by Chemical Formula 5a was obtained according to the same synthesis as Synthesis Example 1 except for using 23 g of 6,6'-(9H-fluorene-9,9-diyl)dinaphthalen-1-ol, 18 g of phenanthren-9-ol, 34 g of 1,3-bis(methoxymethyl)benzene, 115 g of propylene glycol monomethyl ether acetate (PGMEA), and 0.5 g of diethylsulfate.

[Chemical Formula 5a]

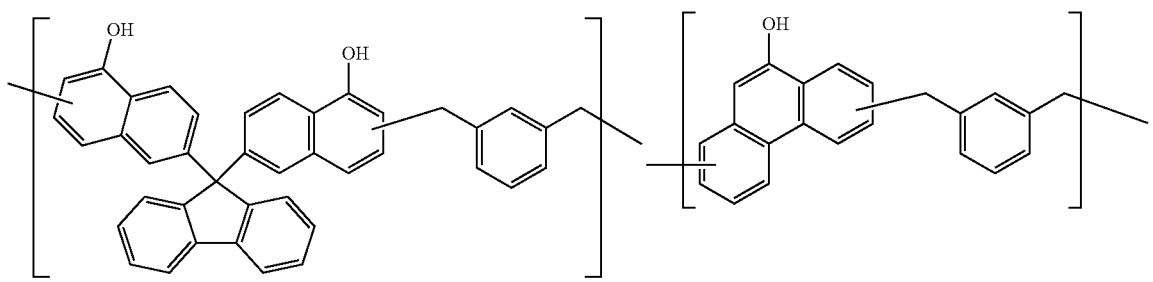

Manufacture of Thin Film

Example 1

A hardmask composition solution was prepared by dissolving 100 parts by weight of the polymer represented by Chemical Formula 1a and 40 parts by weight of a monomer represented by Chemical Formula A, below, (hereinafter, Monomer 1) to together be 10 wt % based on 100 wt % of the entire amount of the composition in a solvent (propylene glycolmonomethyl etheracetate (PGMEA):ethyl lactate (EL), volume ratio=1:1). The solution was spin-on coated on a silicon wafer and soft-baked at 120° C. for 2 minutes, forming a thin film. Subsequently, 2 cc of a mixed solvent (5 wt % of γ-butyrolactone, 20 wt % of ethyl lactate, and 75 wt % of ethyl-3-ethoxypropionate) was injected on the thin film in the spin-on state and then removed along with a part of the thin film. Then, the hardmask composition was secondarily coated and hard-baked at 400° C. for 2 minutes, adjusting the thin film to have a, e.g., total, thickness of 2,500 Å on a bare wafer (Thickness Measurement: ST5000 made by KMAC, hereinafter, used in Examples and Comparative Examples).

[Chemical Formula A]

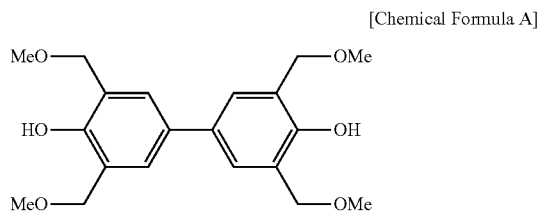 [SMILES: COCc1cc(-c2cc(COC)c(O)c(COC)c2)cc(COC)c1O]

In Chemical Formula A, Me is a methyl group.

Example 2

A hardmask composition solution was prepared by dissolving 100 parts by weight of the polymer represented by Chemical Formula 1a and 40 parts by weight of Monomer 1 to together be 10 wt % based on 100 wt % of the entire amount of the composition in a solvent (PGMEA/EL=vol. 1:1). The solution was spin-on coated on a silicon wafer and then, soft-baked at 150° C. for 2 minutes, forming a thin film. Then, 2 cc of a mixed solvent (5 wt % of γ-butyrolactone, 20 wt % of ethyl lactate, and 75 wt % of ethyl-3-ethoxypropionate) was injected on the thin film in the spin-on state and then removed along with a part of the thin film. Subsequently, the hardmask composition was secondarily coated and hard-baked at 400° C. for 2 minutes, adjusting the thin film to have a thickness of 2,500 Å on the bare wafer.

Example 3

A hardmask composition solution was prepared by dissolving 100 parts by weight of the polymer represented by Chemical Formula 1a, 30 parts by weight of a monomer represented by Chemical Formula B, below (hereinafter, Monomer 2), and 0.05 parts by weight of pyridinium p-toluene sulfonate as a thermal acid generator to all together be 10 wt % based on 100 wt % of the entire composition in a solvent (PGMEA/EL=vol. 1:1). The obtained solution was spin-on coated on a patterned wafer and soft-baked at 120° C. for 1 minute, forming a thin film. Then, 2 cc of a mixed solvent (5 wt % of γ-butyrolactone, 20 wt % of ethyl lactate, and 75 wt % of ethyl-3-ethoxypropionate) was injected on the thin film in the spin-on state and then removed along with a part of the thin film. Subsequently, the hardmask composition was secondarily coated and hard-baked at 400° C. for 2 minute, adjusting the thin film to have a thickness of 2,500 Å on the bare wafer.

[Chemical Formula B]

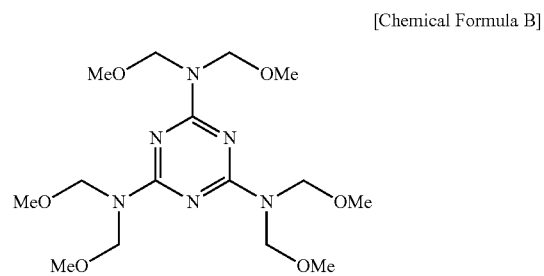 [SMILES: COCN(COC)c1nc(N(COC)COC)nc(N(COC)COC)n1]

Example 4

A hardmask composition solution was prepared by dissolving 100 parts by weight of the polymer represented by Chemical Formula 1a, 20 parts by weight of Monomer 1 to together be 10 wt % based on 100 wt % of the entire composition in a solvent (PGMEA/EL=vol. 1:1). The solution was spin-on coated on a silicon wafer and soft-baked at 170° C. for 2 minutes, forming a thin film. Subsequently, 2 cc of a mixed solvent (5 wt % of γ-butyrolactone, 20 wt % of ethyllactate, and 75 wt % of ethyl-3-ethoxypropionate) was injected on the thin film in the spin-on state and then, removed with a part of the thin film. Then, the hardmask composition was secondarily coated and hard-baked at 400° C. for 2 minutes, adjusting the thin film to have a thickness of 2500 Å on the bare wafer.

Example 5

A hardmask composition solution was prepared by dissolving 100 parts by weight of the polymer represented by Chemical Formula 1a, 40 parts by weight of Monomer 1, and 0.05 parts by weight of pyridinium p-toluenesulfonate as a thermal acid generator to all together be 10 wt % based on 100 wt % of the entire composition in a solvent (PGMEA/EL=vol. 1:1). The solution was spin-on coated on a silicon wafer and then soft-baked at 120° C. for 2 minute, forming a thin film. Then, 5 cc of a mixed solvent (5 wt % of γ-butyrolactone, 20 wt % of ethyllactate, and 75 wt % of ethyl-3-ethoxypropionate) was injected on the thin film in the spin-on state and removed along with a part of the thin film. Subsequently, the hardmask composition was secondarily coated and hard-baked at 400° C. for 2 minute, adjusting the thin film to have a thickness of 2,500 Å on the bare wafer.

Example 6

A hardmask composition solution was prepared by dissolving 100 parts by weight of the polymer represented by Chemical Formula 2a and 10 parts by weight of the Monomer 1 to together be 10 wt % based on 100 wt % of the entire composition in a solvent (PGMEA/EL=vol. 1:1). The solution was spin-on coated on a silicon wafer and then soft-baked at 150° C. for 2 minute, forming a thin film. Then, 2 cc of a mixed solvent (5 wt % of γ-butyrolactone, 20 wt % of ethyllactate, and 75 wt % of ethyl-3-ethoxypropionate) was injected on the thin film in the spin-on state and removed along with a part of the thin film. Subsequently, the hardmask composition was secondarily coated and hard-baked at 400° C. for 2 minute, adjusting the thin film to have a thickness of 2,500 Å on the bare wafer.

Example 7

A hardmask composition solution was prepared by dissolving 100 parts by weight of the polymer represented by Chemical Formula 3a and 30 parts by weight of Monomer 2 to together be 10 wt % based on 100 wt % of the entire composition in a solvent (PGMEA/EL=vol. 1:1). The solution was spin-on coated on a silicon wafer and then, soft-baked at 140° C. for 2 minute, forming a thin film. Then, 2 cc of a mixed solvent (5 wt % of γ-butyrolactone, 20 wt % of ethyllactate, and 75 wt % of ethyl-3-ethoxypropionate) was injected on the thin film in the spin-on state and removed along with a part of the thin film. Subsequently, the hardmask composition was secondarily coated and hard-baked at 400° C. for 2 minute, adjusting the thin film to have a thickness of 2,500 Å on the bare wafer.

Example 8

A hardmask composition solution was prepared by dissolving 100 parts by weight of the polymer represented by Chemical Formula 5a, 10 parts by weight of Monomer 2, and 0.05 parts by weight of pyridinium p-toluenesulfonate as a thermal acid generator to all together be 10 wt % based on 100 wt % of the entire composition in a solvent (PGMEA/EL=vol. 1:1). Then, 2 cc of a mixed solvent (5 wt % of γ-butyrolactone, 20 wt % of ethyllactate, and 75 wt % of ethyl-3-ethoxypropionate) was injected on the thin film in the spin-on state and removed along with a part of the thin film. Subsequently, the hardmask composition was secondarily coated and hard-baked at 400° C. for 2 minute, adjusting the thin film to have a thickness of 2,500 Å on the bare wafer.

Comparative Example 1

A hardmask composition solution was prepared by dissolving 100 parts by weight of the polymer represented by Chemical Formula 1a and 40 parts by weight of Monomer 1 to together be 10 wt % based on 100 wt % of the entire composition in a solvent (PGMEA/EL=vol. 1:1). The solution was spin-on coated on a silicon wafer and then, hard-baked at 400° C. for 2 minute, forming a 2,500 Å-thick thin film on the bare wafer.

Comparative Example 2

A hardmask composition solution was prepared by dissolving 100 parts by weight of the polymer represented by Chemical Formula 1a, 30 parts by weight of Monomer 2, and 0.05 parts by weight of pyridinium p-toluenesulfonate as a thermal acid generator to all together be 10 wt % based on 100 wt % of the entire composition in a solvent (PGMEA/EL=vol. 1:1). The solution was spin-on coated on a silicon wafer and then, hard-baked at 400° C. for 2 minute, forming a 2,500 Å-thick thin film on the bare wafer.

Comparative Example 3

A hardmask composition solution was prepared by dissolving 100 parts by weight of the polymer represented by Chemical Formula 1a and 20 parts by weight of Monomer 1 to together be 10 wt % based on 100 wt % of the entire composition in a solvent (PGMEA/EL=vol. 1:1). The solution was spin-on coated on a silicon wafer and then, hard-baked at 400° C. for 2 minute, forming a 2,500 Å-thick thin film on the bare wafer.

Comparative Example 4

A hardmask composition solution was prepared by dissolving 100 parts by weight of the polymer represented by Chemical Formula 2a and 10 parts by weight of Monomer 1 to together be 10 wt % based on 100 wt % of the entire composition in a solvent (PGMEA/EL=vol. 1:1). The solution was spin-on coated on a silicon wafer and then, hard-baked at 400° C. for 2 minute, forming a 2,500 Å-thick thin film on the bare wafer.

Comparative Example 5

A hardmask composition solution was prepared by dissolving 100 parts by weight of the polymer represented by Chemical Formula 3a and 40 parts by weight of Monomer 1 to together be 10 wt % based on 100 wt % of the entire composition in a solvent (PGMEA/EL=vol. 1:1). The solution was spin-on coated on a silicon wafer and then, hard-baked at 400° C. for 2 minute, forming a 2,500 Å-thick thin film on the bare wafer.

Comparative Example 6

A hardmask composition solution was prepared by dissolving 100 parts by weight of the polymer represented by Chemical Formula 4a and 10 parts by weight of Monomer 1 to together be 10 wt % based on 100 wt % of the entire composition in a solvent (PGMEA/EL=vol. 1:1). The solution was spin-on coated on a silicon wafer and then, hard-baked at 400° C. for 2 minute, forming a 2,500 Å-thick thin film on the bare wafer.

Comparative Example 7

A hardmask composition solution was prepared by dissolving 100 parts by weight of the polymer represented by Chemical Formula 5a to be 10 wt % based on 100 wt % of the entire composition in a solvent (PGMEA/EL=vol. 1:1). The solution was spin-on coated on a silicon wafer and then, hard-baked at 400° C. for 2 minute, forming a 2,500 Å-thick thin film on the bare wafer.

Comparative Example 8

A hardmask composition solution was prepared by dissolving 100 parts by weight of the polymer represented by Chemical Formula 5a and 10 parts by weight of Monomer 1 to together be 10 wt % based on 100 wt % of the entire composition in a solvent (PGMEA/EL=vol. 1:1). The solution was spin-on coated on a silicon wafer and then, hard-baked at 400° C. for 2 minute, forming a 2,500 Å-thick thin film on the bare wafer.

Planarization Characteristic Evaluation of Thin Film

Planarization characteristics of the final thin film were evaluated by examining a step and a void.

The step was evaluated by respectively coating the hardmask compositions on a pattern wafer having L/S of 1:1 and a line width of 50 nm and a pattern wafer having C/H of 1:1 and a hole of 60 nm to form each hardmask thin film according to Examples 1 to 7 and Comparative Examples 1 to 7, and cutting the cross section of the film to obtain a sample. Subsequently, the sample was coated with Pt and examined with FE-SEM (SU-8030 Hitachi, Ltd.).

Figure 10:
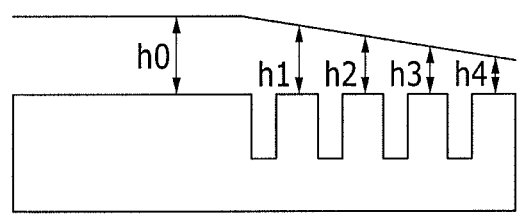
FIG. 10 illustrates a reference view explaining Calculation Equation 1 for evaluating step characteristics.

FIG. 10 illustrates a reference view of Calculation Equation 1 for evaluating the step characteristics. Referring to FIG. 10, the planarization characteristics are regarded to be excellent, as a film thickness difference between in a peripheral region having no pattern and a cell region having a pattern is smaller. For example, |h0−h1|+|h0−h2+|h0−h3|+ |h0−h4|++ . . . + (h0−hn) (n is the number of pattern).

The cross section of the pattern wafer sample was examined by using FE-SEM to see whether the void was generated.

The results are provided in Table 1.

TABLE 1

|  | Step | Void |  | Step | Void |
| --- | --- | --- | --- | --- | --- |
| Example 1 | 280 | X | Comparative Example 1 | 500 | X |
| Example 2 | 230 | X | Comparative Example 2 | 450 | X |
| Example 3 | 103 | X | Comparative Example 3 | 420 | X |
| Example 4 | 50 | X | Comparative Example 4 | 320 | X |
| Example 5 | 88 | X | Comparative Example 5 | 380 | X |
| Example 6 | 30 | X | Comparative Example 6 | 280 | X |
| Example 7 | 68 | X | Comparative Example 7 | 340 | X |
| Example 8 | 45 | X | Comparative Example 8 | 450 | X |

(In Table 1, X indicates no voids.)

Referring to Table 1, the thin films formed by using a polymer as a material for a hardmask layer to form a primary hardmask layer, applying a liquid material to form a secondary hardmask layer according to Examples 1 to 7 showed excellent planarization characteristics, compared with the thin films according to Comparative Examples 1 to 7.

By way of summation and review, according to small-sizing of the pattern to be formed, providing a fine pattern having an excellent profile using above-mentioned typical lithographic technique may be challenging. Accordingly, a layer, called a hardmask layer, may be formed between the material layer and the photoresist layer to provide a fine pattern.

The hardmask layer may play a role of an intermediate layer for transferring the fine pattern of photoresist to the material layer through a selective etching process. Accordingly, the hardmask layer may exhibit characteristics such as heat resistance, etch resistance, and the like to tolerate the multiple etching processes.

In addition, in a multiple patterning process, when a substrate has a step, or a wafer as the substrate has both a pattern-dense region and a pattern-free region, a hardmask layer filled in patterns may have planarization characteristics to help minimize steps between patterns.

A layer structure according to an embodiment may satisfy the above-described characteristics.

The embodiments may provide a method of producing a layer structure for forming a multi-pattern structure such as dual damascene interconnection structure.

The embodiments may provide a method of producing a layer structure showing excellent planarization characteristics (without using a particular etchback or CMP (chemical mechanical polishing) process) and improved etch resistance by using a particular polymer as a layer material.

The method according to an embodiment may provide a layer structure having excellent step characteristics without a particular planarization process such as etchback or CMP and thus may advantageously realize a semiconductor fine pattern. In addition, the method may use a particular polymer to form the layer structure and thus may simultaneously secure etch resistance and solubility.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

DESCRIPTION OF SYMBOLS

| 100: layer structure | 110: substrate |
| --- | --- |
| 120: organic layer | 130: silicon-containing thin layer |
| 140: anti-reflection layer | 150: photoresist layer |

What is claimed is:

1. A method of producing a layer structure, the method comprising:
coating a first composition on a substrate that has a pattern thereon;
curing the coated first composition to form a first organic layer;
applying a liquid material to the first organic layer to remove a part of the first organic layer; and
coating a second composition on remaining parts of the first organic layer such that the coating of the second composition is performed in the same manner as the coating of the first composition; and
curing the coated second composition on the remaining parts of the first organic layer to form a second organic layer:
wherein the first composition and the second composition each independently include:
a solvent, and
a polymer including a structural unit represented by Chemical Formula 1,

  [Chemical Formula 1]

wherein, in Chemical Formula 1,
$A^1$ is a divalent cyclic group including at least one of a substituted or unsubstituted benzene ring,
$B^1$ is a divalent organic group, and
* is a linking point, and
wherein the liquid material includes γ-butyrolactone, δ-valerolactone, ethyllactate, ethyl-3-ethoxypropionate, propylene glycolmonomethyl ether acetate, β-hydroxy β-methylbutyrate, methanol, ethanol, 2-butanol, ethylene glycol, propylene glycol, glycerol, 1,6-hexanediol, cyclo hexanediol, sorbitol, xylitol, 2-methyl-2,4-pentanediol, 1,3-butanediol, 1,4-butanediol, ethylene glycol monomethyl ether, diethylene glycol, dipropylene glycol, propylene glycol monomethyl ether, diethylene glycol monomethyl ether, triethylene glycol, poly(ethylene glycol), propylene glycol monomethyl ether, dipropylene glycol monomethyl ether, tripropylene glycol monomethyl ether, diethylene glycol monobutyl ether, propylene glycol monomethyl ether acetate, ethylethoxy propionate, propylene glycol monomethyl ether propionate, ethylene glycol diacetate, ethyl lactate, butyl lactate, methyl 2-hydroxyisobutyrate, n-butyl acetate, formamide, monomethylformamide, dimethyl formamide, acetamide, monomethylacetamide, dimethyl acetamide, monoethylacetamide, diethylacetamide, N-methylpyrrolidone, methoxy methyl propionate, methoxy ethyl propionate, methoxy propyl propionate, methoxy butyl propionate, ethoxy methyl propionate, ethoxy ethylpropionate, ethoxy propyl propionate, ethoxy butyl propionate, dimethyl sulfone, dimethyl sulfoxide, sulfolane, acetone, acetyl acetone, methylethyl ketone, methyl isobutyl ketone, or a combination thereof.

2. The method as claimed in claim 1, wherein the remaining parts of the first organic layer remain inside gaps of the pattern.

3. The method as claimed in claim 1, wherein the liquid material is applied in an amount of about 0.1 cc to about 100 cc.

4. The method as claimed in claim 1, wherein the first organic layer and the second organic layer are a hardmask layer.

5. The method as claimed in claim 4, wherein the second organic layer is directly on the remaining parts of the first organic layer.

6. The method as claimed in claim 1, wherein, in Chemical Formula 1, $A^1$ is a divalent cyclic group including at least two rings in its structure.

7. The method as claimed in claim 1, wherein, in Chemical Formula 1, $A^1$ is a substituted or unsubstituted divalent cyclic group of one of the following compounds:

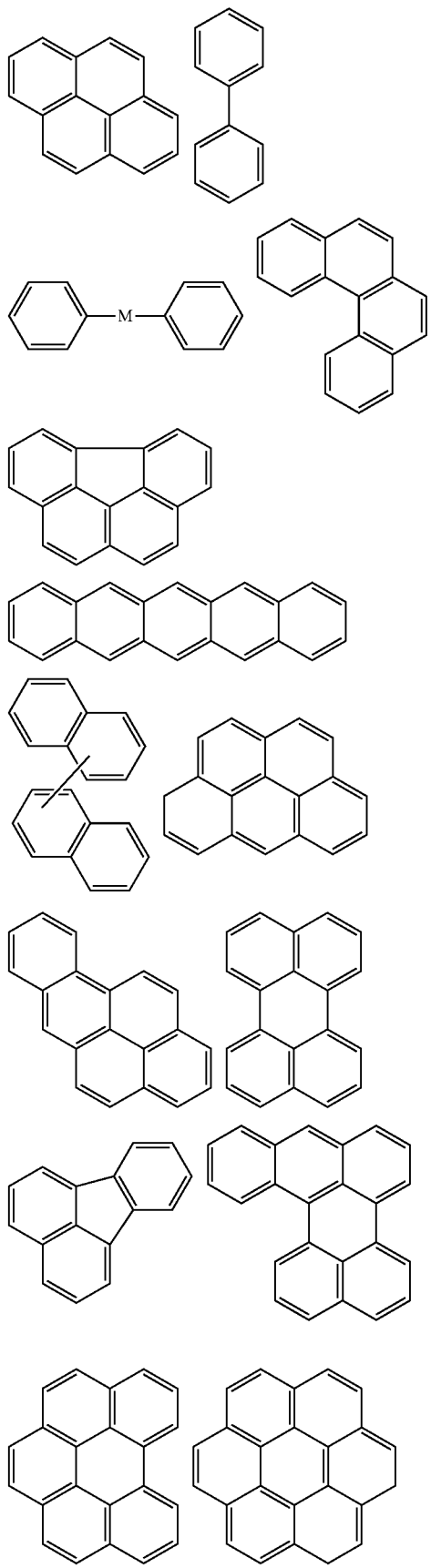

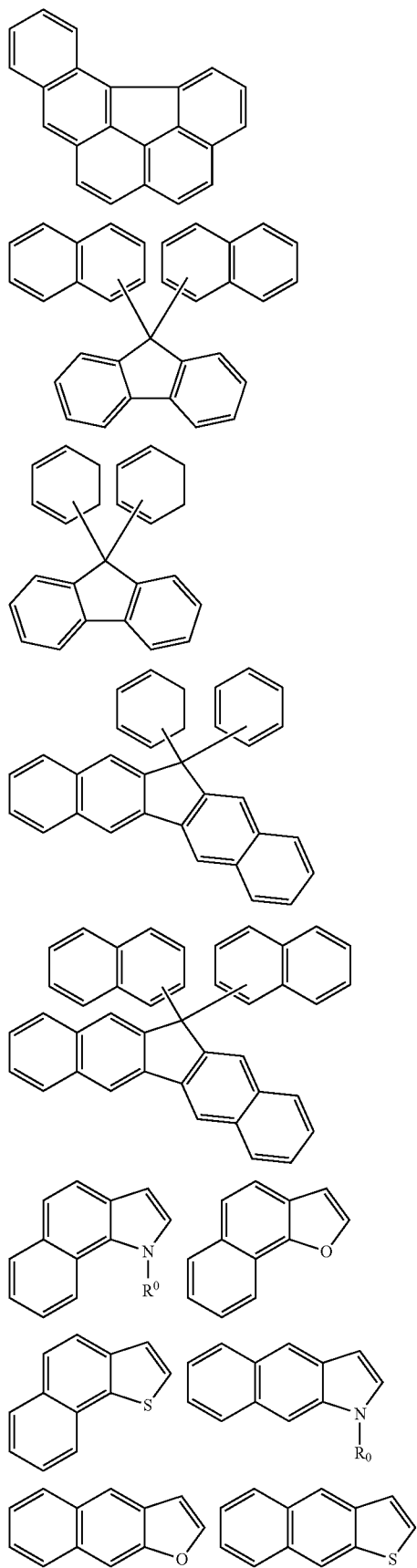
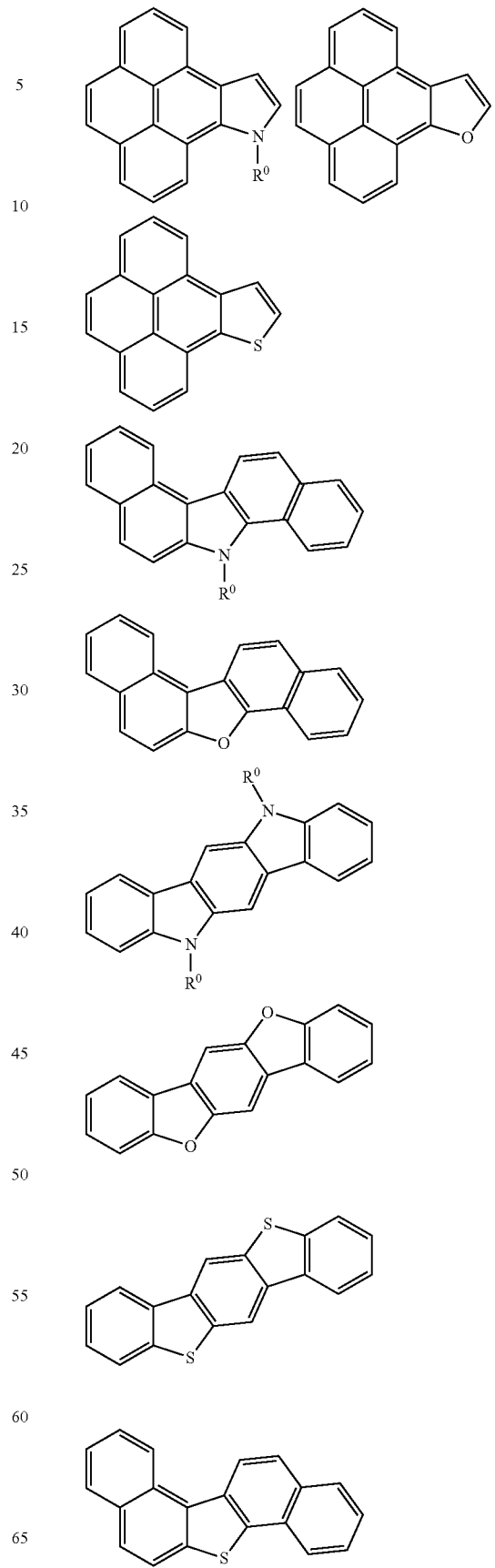

-continued
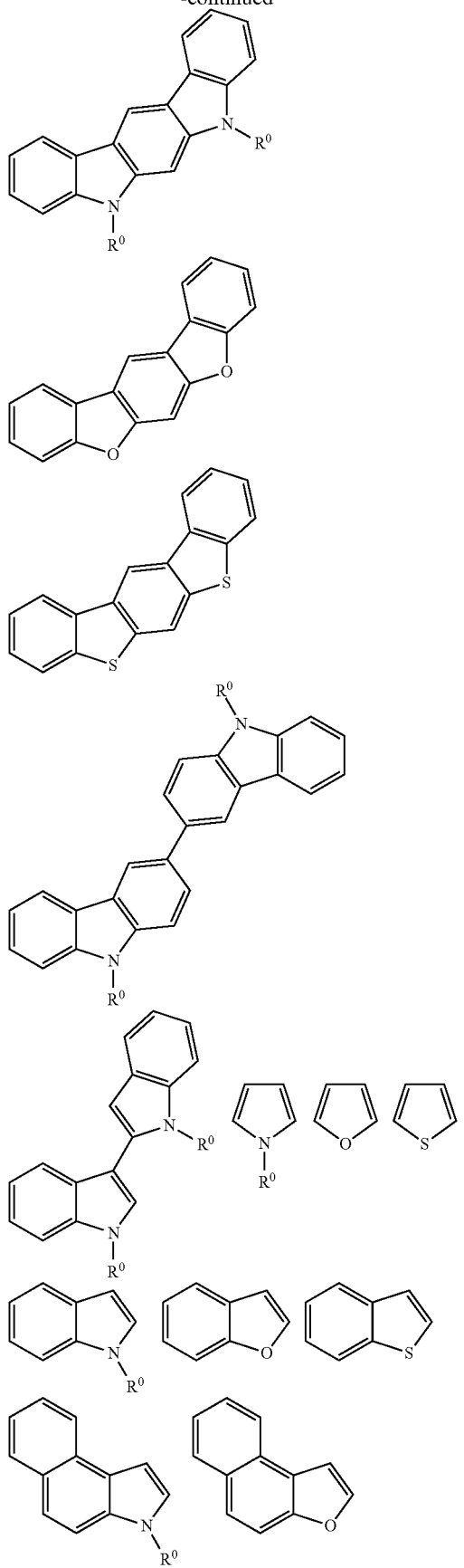
-continued
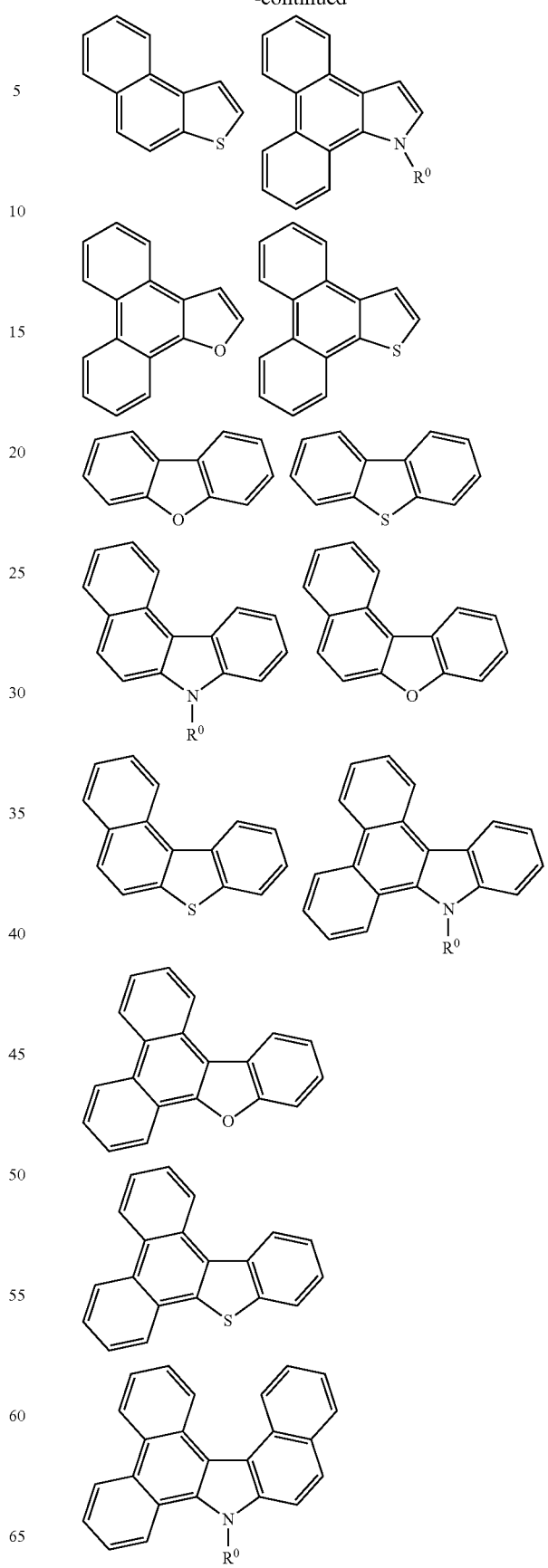

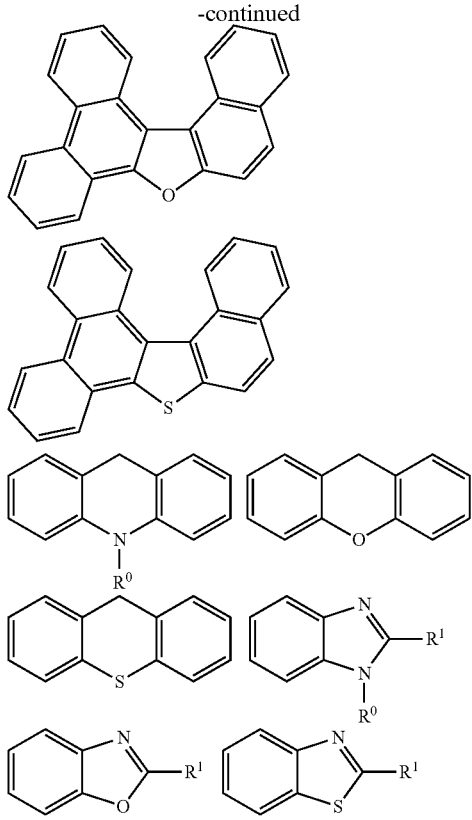

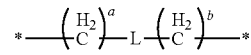

[Chemical Formula 3]

wherein, in Chemical Formula 3, a and b are each independently an integer of 0 to 2, and L is a substituted or unsubstituted divalent cyclic group of one of the following compounds,

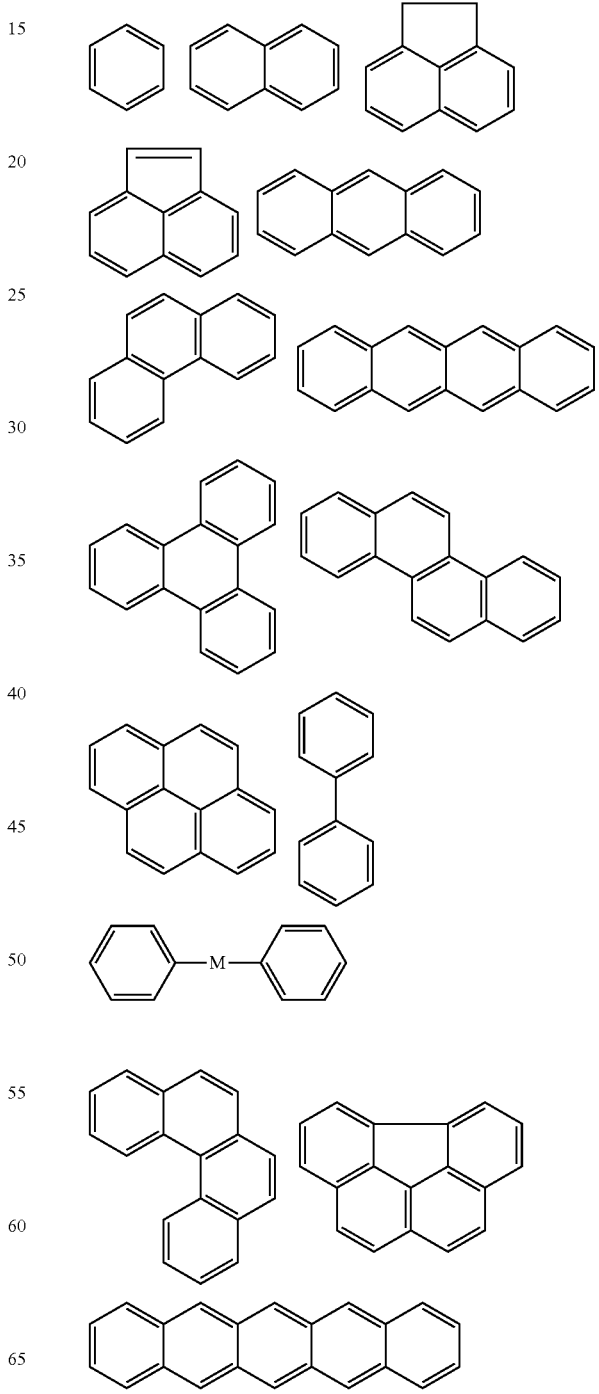

wherein, in the above compounds,

M is a substituted or unsubstituted C1 to C5 alkylene group, —O—, —S—, —SO$_2$—, or carbonyl, and $R^0$ and $R^1$ are each independently hydrogen, a hydroxy group, a methoxy group, an ethoxy group, a halogen atom, a halogen-containing group, a substituted or unsubstituted C1 to C30 alkyl group, a substituted or unsubstituted C6 to C30 aryl group, or a combination thereof.

8. The method as claimed in claim 1, wherein, in Chemical Formula 1, $A^1$ is a group that is substituted with a hydroxy group, a thionyl group, a thiol group, a cyano group, an amino group, a C1 to C10 alkyl group, a C6 to C30 aryl group, a C1 to C30 alkoxy group, or a combination thereof.

9. The method as claimed in claim 1, wherein the polymer further includes a structural unit represented by Chemical Formula 2:

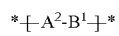 [Chemical Formula 2]

wherein, in Chemical Formula 2, $A^2$ is a divalent cyclic group including at least one of a substituted or unsubstituted benzene ring, and $B^1$ and * are defined the same as those of Chemical Formula 1, and wherein the structural unit represented by Chemical Formula 2 is different from the structural unit represented by Chemical Formula 1.

10. The method as claimed in claim 1, wherein, in Chemical Formula 1, $B^1$ is represented by Chemical Formula 3:

-continued

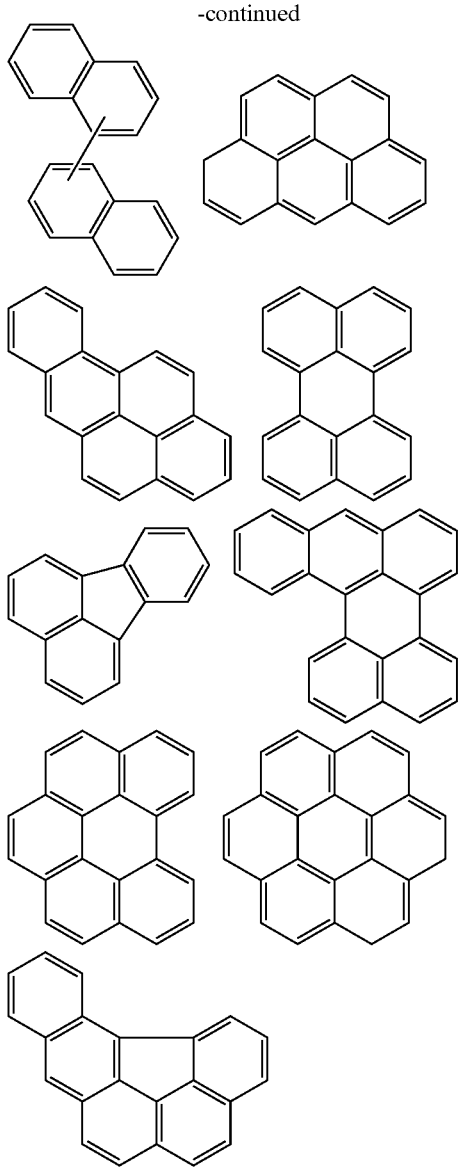

wherein, in the above compounds, M is a substituted or unsubstituted C1 to C5 alkylene group, —O—, —S—, —SO$_2$—, or carbonyl.

11. The method as claimed in claim 1, wherein the polymer has a weight average molecular weight of about 500 to about 200,000.

12. The method as claimed in claim 1, wherein the curing after applying the second composition is performed at a temperature that is higher than a temperature at which the curing after applying the first composition is performed.

13. The method as claimed in claim 1, wherein the first composition and the second composition each independently include a surfactant, a plasticizer, a cross-linking agent, a thermal acid generator, a photoacid generator, or a combination thereof.

14. The method as claimed in claim 13, wherein:
at least one of the first composition or the second composition includes the cross-linking agent, and
the cross-linking agent includes methoxymethylated glycoluril, butoxymethylated glycoluril, methoxymethylated melamine, butoxymethylated melamine, methoxymethylated benzoguanamine, butoxymethylated benzoguanamine, methoxymethylated urea, butoxymethylated urea, methoxymethylated thiourea, butoxymethylated thiourea, methoxymethylatedbenzene, butoxymethylated benzene, methoxymethylated phenol, butoxymethylated phenol, or a combination thereof.

15. The method as claimed in claim 1, wherein the solvent of the first composition and the solvent of second composition each independently include propylene glycol, propylene glycol diacetate, methoxy propanediol, diethylene glycol, diethylene glycol butylether, tri(ethylene glycol) monomethylether, propylene glycol monomethylether, propylene glycol monomethylether acetate, cyclohexanone, ethyllactate, gamma-butyrolactone, N,N-dimethyl formamide, N,N-dimethyl acetamide, methylpyrrolidone, methylpyrrolidinone, acetylacetone, ethyl 3-ethoxypropionate, or a combination thereof.

16. The method as claimed in claim 1, wherein:
coating the first composition includes applying the first composition to a thickness of about 300 Å to about 10 μm, and
coating the second composition includes applying the second composition to a thickness of about 300 Å to about 10 μm.

17. The method as claimed in claim 1, wherein:
one side of the substrate has a first part having a pattern thereon and a second part without a pattern thereon, and
a sum of step differences of the second organic layer is smaller than a sum of step differences of the first organic layer.

18. A method of forming a pattern, the method comprising:
providing a layer structure produced according to the method as claimed in claim 1;
forming a silicon-containing thin layer on the layer structure;
forming a photoresist layer on the silicon-containing thin layer;
exposing and developing the photoresist layer to form a photoresist pattern; and
selectively removing the silicon-containing thin layer and the first organic layer, the second organic layer, or a combination thereof in the layer structure using the photoresist pattern.

19. The method as claimed in claim 18, further comprising forming a bottom antireflective coating prior to forming the photoresist.

* * * * *